United States Patent
Arao et al.

(10) Patent No.: US 6,933,184 B2
(45) Date of Patent: Aug. 23, 2005

(54) METHOD OF MANUFACTURING SEMICONDUCTOR DEVICE

(75) Inventors: Tatsuya Arao, Kanagawa (JP); Hideomi Suzawa, Kanagawa (JP); Koji Ono, Kanagawa (JP); Toru Takayama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/622,584

(22) Filed: Jul. 21, 2003

(65) Prior Publication Data

US 2004/0018670 A1 Jan. 29, 2004

Related U.S. Application Data

(62) Division of application No. 09/873,334, filed on Jun. 5, 2001, now Pat. No. 6,596,571.

(30) Foreign Application Priority Data

Jun. 7, 2000 (JP) .......................................... 2000-170096

(51) Int. Cl.[7] .............................................. H01L 21/84
(52) U.S. Cl. ...................................... 438/163; 438/149
(58) Field of Search ................................... 438/149, 151, 438/163, 197, 299, 301, 592

(56) References Cited

U.S. PATENT DOCUMENTS

| 4,394,182 | A | 7/1983 | Maddox, III |
| 5,851,885 | A | 12/1998 | Wen |
| 6,030,667 | A | 2/2000 | Nakagawa et al. |
| 6,031,290 | A | 2/2000 | Miyazaki et al. |
| 6,130,106 | A | 10/2000 | Zimlich |
| 6,271,065 | B1 | 8/2001 | Miyamoto et al. |
| 6,596,571 | B2 * | 7/2003 | Arao et al. ................. 438/163 |
| 6,706,544 | B2 | 3/2004 | Yamazaki et al. |
| 2001/0041392 | A1 | 11/2001 | Suzawa et al. |
| 2001/0049197 | A1 | 12/2001 | Yamazaki et al. |
| 2002/0006705 | A1 | 1/2002 | Suzawa et al. |

FOREIGN PATENT DOCUMENTS

| JP | 6-148685 | 5/1994 |
| JP | 7-235680 | 9/1995 |
| JP | 8-274336 | 10/1996 |
| JP | 09-293600 | 11/1997 |

OTHER PUBLICATIONS

U.S. Appl. No. 10/105,282.*

* cited by examiner

*Primary Examiner*—Tom Thomas
*Assistant Examiner*—N. Drew Richards
(74) *Attorney, Agent, or Firm*—Fish & Richardson P.C.

(57) ABSTRACT

Conventionally, when a TFT provided with an LDD structure or a TFT provided with a GOLD structure is to be formed, there is a problem in that the manufacturing process becomes complicated, which leads to the increase in the number of steps. An electrode formed of a lamination of a first conductive layer (18b) and a second conductive layer (17c), which have different widths from each other, is formed. After the first conductive layer (18b) is selectively etched to form a first conductive layer (18c), a low concentration impurity region (25a) overlapping the first conductive layer (18c) and a low concentration impurity region (25b) not overlapping the first conductive layer 18c are formed by doping an impurity element at a low concentration.

33 Claims, 25 Drawing Sheets

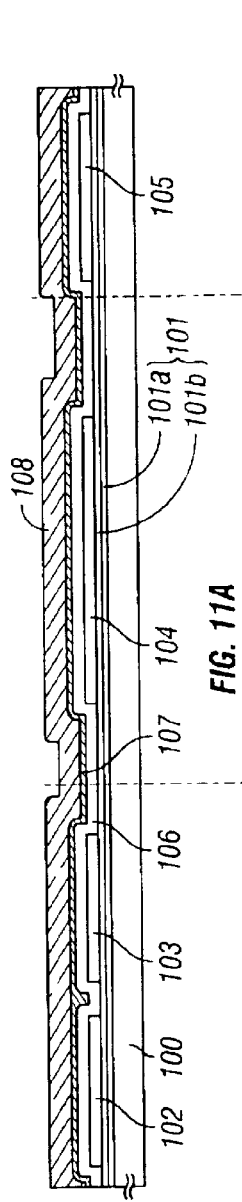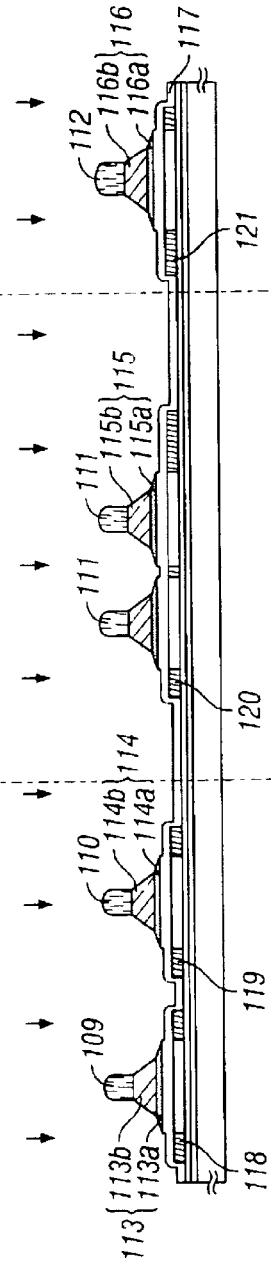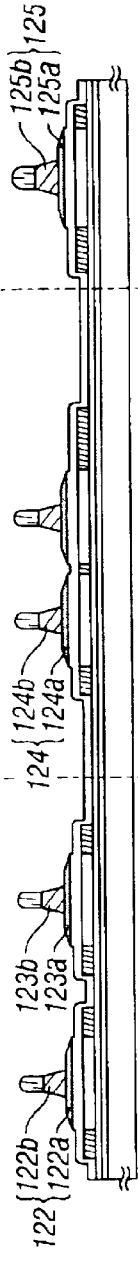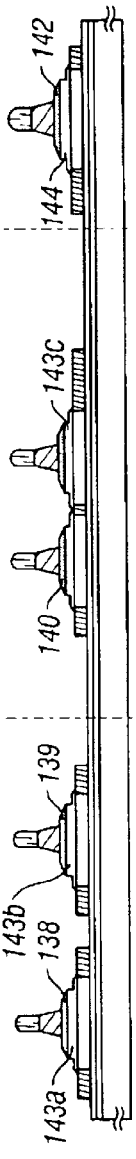

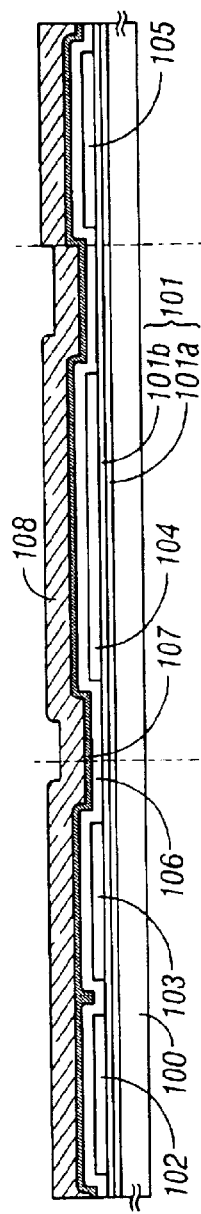
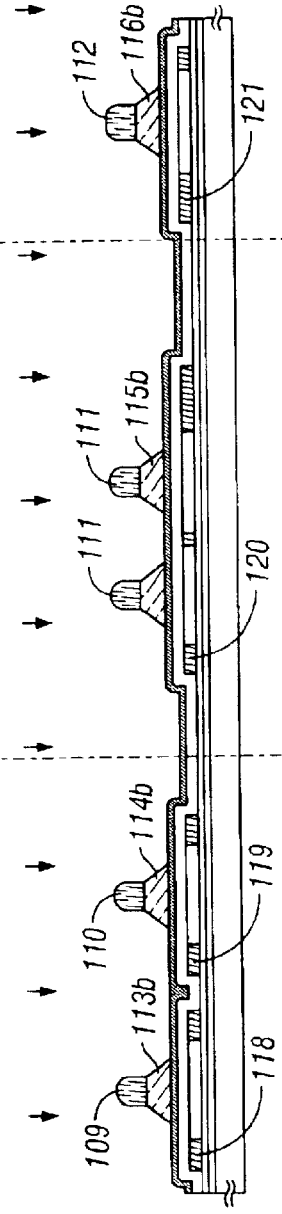
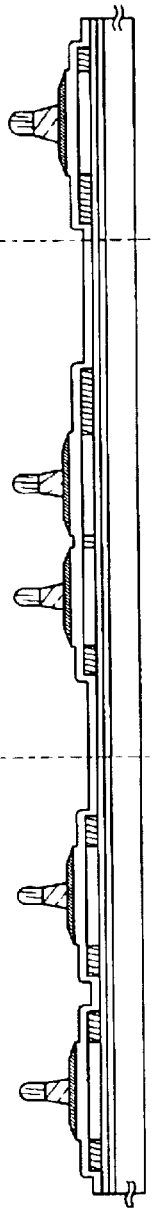
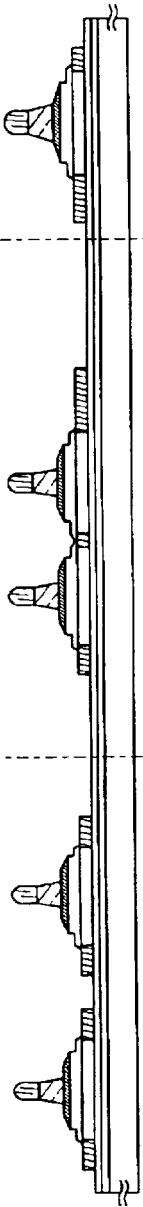
FIG. 21A
FIG. 21B
FIG. 21C
FIG. 21D

METHOD OF MANUFACTURING SEMICONDUCTOR DEVICE

CROSS-REFERENCE TO RELATED APPLICATION

This application is a divisional application of U.S. application Ser. No. 09/873,334, filed on Jun. 5, 2001 now U.S. Pat. No. 6,596,571, now allowed, which claims the benefit of a foreign priority application filed in Japan, Serial No. 2000-170096, filed Jun. 7, 2000, both of which are incorporated by reference.

BACKGROUND OF THE INVENTION

1. Field of the Invention

The present invention relates to a semiconductor device having a circuit constituted of thin film transistors (hereinafter referred to as TFTs) and a method of manufacturing the same. More specifically, the present invention relates to an electro-optical device typified by a liquid crystal display panel and electronic equipment that mounts such an electro-optical device as its component.

It is to be noted that semiconductor devices through this specification refer to devices that can function by utilizing semiconductor characteristics in general, and electro-optical devices, semiconductor circuits, and electronic equipment are all the semiconductor devices.

2. Description of the Related Art

In recent years, development of a semiconductor device having an integrated circuit with large area constituted of thin film transistors (TFTs) formed of a semiconductor thin film (approximately several to several hundred nm in thickness) formed on a substrate having an insulating surface is making progress. An active matrix liquid crystal display device, an EL display device, and a contact type image sensor are known as typical examples of the semiconductor device. In particular, since a TFT in which a crystalline silicon film (typically, a poly-silicon film) is an active layer (hereafter referred to as a poly-silicon TFT) has high field-effect mobility, the TFT can constitute various functional circuits.

For example, in an active matrix liquid crystal display device, a driver circuit for controlling a pixel circuit for displaying images with each functional block and pixel circuits such as a shift register circuit with a CMOS circuit as a base, a level shifter circuit, a buffer circuit, and a sampling circuit is formed on a substrate.

TFTs (pixel TFTs) are arranged in several tens to several million pixels, respectively, in the pixel circuit of the active matrix liquid crystal display device, and the pixel TFTs are provided with pixel electrodes, respectively. An opposing electrode is provided on the side of an opposing substrate sandwiching liquid crystal with the substrate to thereby form a condenser with the liquid crystal as dielectric. The voltage applied to the respective pixels is controlled by a switching function of the TFT to drive the liquid crystal by controlling electric charge to the condenser. Thus, transmission light amount is controlled to display images.

The pixel TFT consists of an n-channel TFT and is driven as a switching element by applying a voltage to the liquid crystal. Since the liquid crystal is driven with an alternating current, a method called frame inversion driving is adopted in many cases. In this method, it is important to sufficiently lower an off current value (a drain current that flows during off operation of a TFT) as a characteristic required to the pixel TFT in order to suppress power consumption.

A lightly doped drain (LDD) structure is known as a TFT structure for reducing an off current value. This structure is such that a region added with an impurity element at low concentration is provided between a channel forming region and a source region or a drain region formed by adding an impurity element at high concentration, and the provided region is called an LDD region. Further, a GOLD (gate-drain overlapped LDD) structure in which an LDD region and a gate electrode are overlapped with each other through a gate insulating film is known as means for preventing deterioration in an on current value due to hot carrier. It is known that such a structure makes a high electric field in the vicinity of a drain to be relaxed to prevent hot carrier injection, and thus, which is effective in preventing deterioration.

Although the GOLD structure is effective in preventing deterioration in an on current value, on the other hand, there has been a problem in that an off current value becomes large in the GOLD structure compared with a general LDD structure. Therefore, the GOLD structure is not preferable for being applied to a pixel TFT. On the contrary, the general LDD structure is effective in suppressing the off current value, but has a little effect in preventing deterioration due to hot carrier injection by relaxing an electric field in the vicinity of a drain. As described above, in a semiconductor device having a plurality of integrated circuits such as an active matrix liquid crystal display device, the above problem clearly exists as in particular, in a crystalline silicon TFT and is becoming more evident as performance required for the active matrix liquid crystal display device is enhanced.

Conventionally, when the TFT provided with the LDD structure or the TFT provided with the GOLD structure is to be formed, there is a problem in that the manufacturing process becomes complicated and the number of steps increases. It is clear that the increase in the number of steps becomes not only the cause of the increase in manufacturing cost but also the cause of the reduction in manufacturing yield.

SUMMARY OF THE INVENTION

The present invention is a technique for solving the above problems, and an object of the present invention is to improve operational characteristics and reliability of a semiconductor device and to realize low power consumption, and also to realize reduction in manufacturing cost and improvement in yield by reducing the number of steps in an electro-optical device and a semiconductor device typified by an active matrix liquid crystal display device manufactured by using TFTs.

Reducing the number of steps may be regarded as a means for realizing the reduction in manufacturing cost and the improvement in yield. Specifically, the number of photo masks required for manufacturing TFTs is reduced. A photo mask is used for forming a resist pattern as a mask on a substrate in an etching step in a photolithography technique. Accordingly, the usage of one photo mask means that a resist peeling step, a washing step, a drying step and the like are added before and after the etching step in addition to a film forming step, the etching step and the like, and that complicated steps such as resist application, pre-baking, exposure, development and post-baking are performed in the photolithography step.

The present invention is characterized in that the number of masks is reduced in comparison with the prior art and a TFT is manufactured by the manufacturing process described below. Note that one example of a manufacturing method of the present invention is shown in FIGS. 1A to 2D.

The structure of the present invention disclosed in this specification is a method of manufacturing a semiconductor device comprising:

a first step of forming a semiconductor layer on an insulating surface;

a second step of forming an insulating film on the semiconductor layer;

a third step of forming a first electrode comprising a lamination of a first conductive layer having a first width (W1) and a second conductive layer on the insulating film;

a fourth step of forming a high concentration impurity region by adding an impurity element to the semiconductor layer using the first electrode as a mask;

a fifth step of forming a second electrode comprising a lamination of the first conductive layer having the first width (W1) and a second conductive layer having a second width (W2) by etching the second conductive layer of the first electrode;

a sixth step of forming a third electrode comprising a lamination of a first conductive layer having a third width (W3) and the second conductive layer having the second width (W2) by etching the first conductive layer of the second electrode; and a seventh step of forming a low concentration impurity region by adding an impurity element to the semiconductor layer through the first conductive layer or the insulating film using the second conductive layer as a mask.

Further, another example of the manufacturing method of the present invention is shown in FIGS. 3A to 4D. The structure of the present invention is a method of manufacturing a semiconductor device comprising:

a first step of forming a semiconductor layer on an insulating surface;

a second step of forming an insulating film on the semiconductor layer;

a third step of forming a first electrode comprising a lamination of a first conductive layer having a first width (W1) and a second conductive layer on the insulating film;

a fourth step of forming a second electrode comprising a lamination of the first conductive layer having the first width (W1) and a second conductive layer having a second width (W2) by etching the second conductive layer of the first electrode;

a fifth step of forming a high concentration impurity region by adding an impurity element to the semiconductor layer using the second electrode as a mask;

a sixth step of forming a third electrode comprising a lamination of a first conductive layer having a third width (W3) and the second conductive layer having the second width (W2) by etching the first conductive layer of the second electrode; and a seventh step of forming a low concentration impurity region by adding an impurity element to the semiconductor layer through the first conductive layer or the insulating film using the second conductive layer as a mask.

In the respective manufacturing methods described above, it is characterized in that the second width (W2) is narrower than the first width (W1). Further in the manufacturing methods, it is characterized in that the third width (W3) is narrower than the first width (W1) and is wider than the second width (W2).

Further, in the respective manufacturing methods, the third step is characterized in that after a first conductive film and a second conductive film are formed in a lamination on the insulating film, the second conductive layer is formed by performing a first etching process with the second conductive film, and the first conductive layer is formed by performing a second etching process with the first conductive film, whereby the first electrode comprising a lamination of the first conductive layer having the first width (W1) and the second conductive layer is formed.

Moreover, still another example of the manufacturing method of the present invention is shown in FIGS. 5A to 6D. The structure of the present invention is a method of manufacturing a semiconductor device comprising:

a first step of forming a semiconductor layer on an insulating surface;

a second step of forming an insulating film on the semiconductor layer;

a third step of forming a first conductive film and a second conductive film in a lamination on the insulating film;

a fourth step of forming a second conductive layer having a first width (X1) by etching the second conductive film;

a fifth step of forming a high concentration impurity region by adding an impurity element to the semiconductor layer through the first conductive film or the insulating film using the second conductive layer having a first width (X1) as a mask;

a sixth step of forming a first electrode comprising a lamination of a first conductive layer having a second width (X2) and a second conductive layer having a third width (X3) by etching the first conductive film;

a seventh step of forming a second electrode comprising a lamination of the first conductive layer having the second width (X2) and a second conductive layer having a fourth width (X4) by etching the second conductive layer of the first electrode;

an eighth step of forming a third electrode comprising a lamination of a first conductive layer having a fifth width (X5) and a second conductive layer having the fourth width (X4) by etching the first conductive layer of the second electrode; and a ninth step of forming a low concentration impurity region by adding an impurity element to the semiconductor layer through the first conductive layer or the insulating film using the second conductive layer having the fourth width (X4) as a mask.

The above manufacturing method is characterized in that the second width (X2) is narrower than the first width (X1). Further, it is characterized in that the fifth width (X5) is narrower than the second width (X2) and is wider than the fourth width (X4).

Further, still another example of the manufacturing method of the present invention is shown in FIGS. 7A to 8C. The structure of the present invention is a manufacturing method of a semiconductor device comprising:

a first step of forming a semiconductor layer on an insulating surface;

a second step of forming an insulating film on the semiconductor layer;

a third step of forming a first conductive film and a second conductive film in lamination on the insulating film;

a fourth step of forming a second conductive layer having a first width (X1) by etching the second conductive film;

a fifth step of forming a high concentration impurity region by adding an impurity element to the semiconductor layer through the first conductive film or the insulating film using the second conductive layer having the first width (X1) as a mask;

a sixth step of forming a second conductive layer having a second width (Y2) by etching the second conductive layer;

a seventh step of forming an electrode comprising a lamination of a first conductive layer having a third width (Y3) and the second conductive layer having the second width (Y2) by etching the first conductive film; and an eighth step of forming a low concentration impurity region by adding an impurity element to the semiconductor layer through the first conductive layer or the insulating film using the second conductive layer having the second width (Y2) as a mask.

The above manufacturing method is characterized in that the second width (Y2) is narrower than the first width (X1). Further, it is characterized in that the third width (Y3) is narrower than the first width (X1) and is wider than the second width (Y2).

Furthermore, still another example of the manufacturing method of the present invention is shown in FIGS. 9A to 10B. The structure of the present invention is a method of manufacturing a semiconductor device comprising:

a first step of forming a semiconductor layer on an insulating surface;

a second step of forming an insulating film on the semiconductor layer;

a third step of forming a first conductive film and a second conductive film in lamination on the insulating film;

a fourth step of forming a second conductive layer having a first width (X1) by etching the second conductive film;

a fifth step of forming a high concentration impurity region by adding an impurity element to the semiconductor layer through the first conductive film or the insulating film using the second conductive layer having the first width (X1) as a mask;

a sixth step of forming an electrode comprising a lamination of a first conductive layer having a second width (Z2) and a second conductive layer having a third width (Z3) by etching the first conductive film and the second conductive layer; and a seventh step of forming a low concentration impurity region by adding an impurity element to the semiconductor layer through the first conductive layer or the insulating film using the second conductive layer having the third width (Z3) as a mask.

The above manufacturing method is characterized in that the third width (Z3) is narrower than the first width (X1). Further, the above manufacturing method is characterized in that the second width (Z2) is narrower than the first width (X1) and is wider than the third width (Z3).

Further, in the respective methods described above, the impurity element is an impurity element that imparts an n-type conductivity or a p-type conductivity to the semiconductor.

BRIEF DESCRIPTION OF THE DRAWINGS

In the accompanying drawings:

FIGS. 11A to 11D show a manufacturing process of an AM-LCD (Embodiment 1);

FIGS. 21A to 21D show a manufacturing process of an AM-LCD (Embodiment 8);

DETAILED DESCRIPTION OF THE PREFERRED EMBODIMENTS

[Embodiment Mode 1]

Figure 1A:
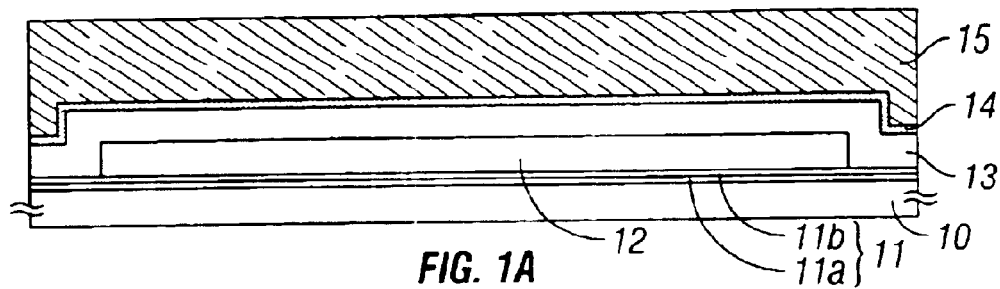
FIGS. 1A to 1D show a manufacturing process of a TFT (Embodiment Mode 1)

Embodiment Mode 1 of the present invention is explained below with reference to FIGS. 1A to 2D.

First, a base insulating film 11 is formed on a substrate 10. A glass substrate, a quartz substrate, a silicon substrate, a metal substrate or a stainless substrate, on which an insulating film is formed on the surface, may be used as the substrate 10. Also, a plastic substrate having heat-resistance that can stand a process temperature may be used.

Further, the base insulating film 11 formed of an insulating film such as a silicon oxide film, silicon nitride film, or a silicon oxynitride film is formed. The base insulating film 11 having a two-layer structure (11a, 11b) is shown here, but the structure of a single layer or a lamination of two or more layers of the above insulating film may be used. Note that the base insulating film 11 may not be formed.

Next, a semiconductor layer 12 is formed on the base insulating film 11. The semiconductor layer 12 is formed such that a semiconductor film having an amorphous structure is formed by a known method (a sputtering method, an LPCVD method, or a plasma CVD method), the formed semiconductor film is subjected to a known crystallization process (a laser crystallization method, a thermal crystallization method, or a thermal crystallization method using a catalyst such as nickel) to obtain a crystalline semiconductor film, and the crystalline semiconductor film is patterned into desired shapes using a first photo mask. The semiconductor layer 12 is formed with a thickness of 25 to 80 nm (preferably from 30 to 60 nm). The material of the crystalline semiconductor film is not particularly limited, but it is preferable to form the film using silicon, a silicon germanium (SiGe) alloy, or the like.

Subsequently, an insulating film 13 that covers the semiconductor layer 12 is formed.

The insulating film 13 is formed of a single layer or a lamination of an insulating film containing silicon with a thickness of 40 to 150 nm by using a plasma CVD method or a sputtering method. Note that this insulating film 13 becomes a gate insulating film.

Next, a first conductive film 14 with a thickness of 20 to 100 nm and a second conductive film 15 with a thickness of 100 to 400 nm are formed in lamination on the insulating film 13 (FIG. 1A). Here, the first conductive film 14 made of a TaN film and the second conductive film 15 made of a W film are formed in lamination by using a sputtering method. Note that the first conductive film 14 is a TaN film and the second conductive film 15 is a W film here, but there is no limitation on those films. Both the first conductive film 14 and the second conductive film 15 may be formed from an element selected from the group consisting of Ta, W, Ti, Mo, Al and Cu, or an alloy material or a compound material containing the above element as its main constituent. Also, a semiconductor film typified by a polycrystalline film doped with an impurity element such as phosphorus may be used.

Figure 1B:
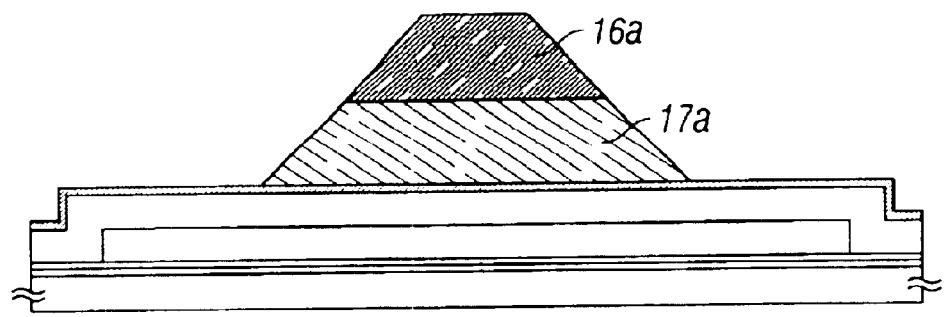

Subsequently, a resist mask 16a is formed using a second photo mask, and a first etching process is conducted using an ICP etching apparatus. By this first etching process, the second conductive film 15 is etched, and a second conductive layer 17a having a portion having a tapered shape (a tapered portion) at its end portion is obtained as shown in FIG. 1B.

Here, an angle of the tapered portion (a taper angle) is defined as an angle formed by a surface of the substrate 10 (a level surface) and a slant portion of the tapered portion. The taper angle of the second conductive layer 17a may be set in a range of 5 to 45° by appropriately selecting an etching condition.

Figure 1C:
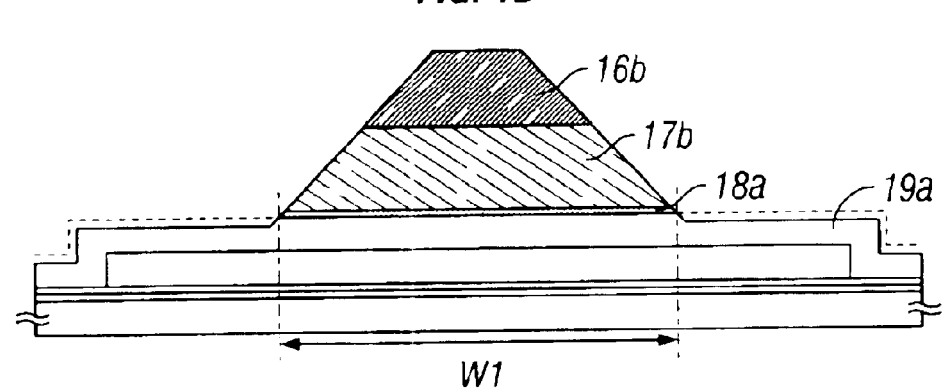

Next, the resist mask 16a is used as it is, and a second etching process is conducted using the ICP etching apparatus. By this second etching process the first conductive film 14 is etched to form a first conductive layer 18a as shown in FIG. 1C. The first conductive layer 18a has a first width (W1). As shown in FIGS. 1A to 1D, in a case where the cross-sectional shape is a trapezoid, "width" indicates the length of the lower side of the trapezoid. Note that in this second etching, the resist mask 16a, the second conductive layer 17a and the insulating film 13 are also etched a little, and a resist mask 16b, a second conductive layer 17b and an insulating film 19a are formed, respectively.

Although two etching processes (the first etching process and the second etching process) are conducted here in order to suppress reduction in thickness of the insulating film 13, the present invention is not particularly limited to this provided that the electrode structure as shown in FIG. 1C (a lamination of the second conductive layer 17b and the first conductive layer 18a) may be formed. One etching process may be conducted.

Figure 1D:
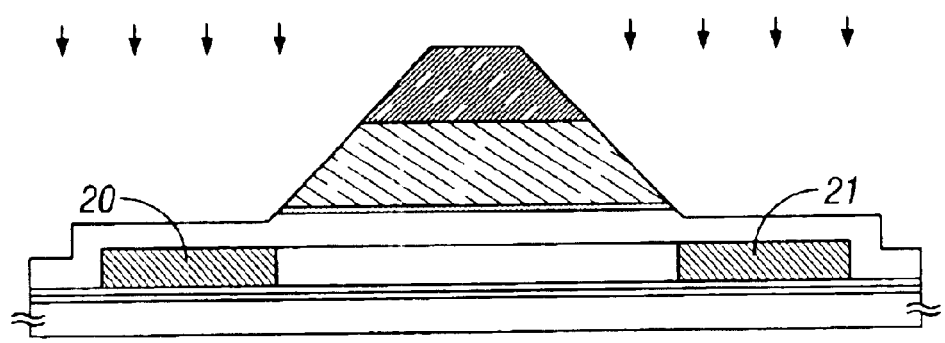

Next, while the resist mask 16b is kept as it is, a first doping process is performed. By this first doping process, through doping is conducted through the insulating film 19a to form high concentration impurity regions 20 and 21 (FIG. 1D).

Figure 2A:
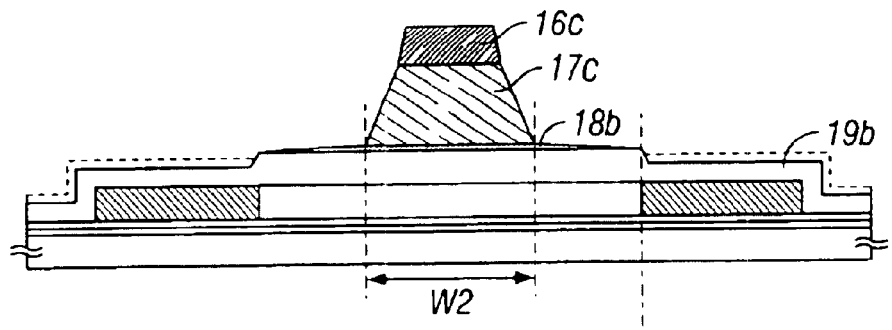
FIGS. 2A to 2D show the manufacturing process of a TFT (Embodiment Mode 1)

Subsequently, a third etching process is conducted using the ICP etching apparatus by using the resist mask 16b. By this third etching process, the second conductive layer 17b is etched to form a second conductive layer 17c as shown in FIG. 2A. The second conductive layer 17c has a second width (W2). Note that, in this third etching process, the resist mask 16b, the first conductive layer 18a and the insulating film 19a are also etched a little, and a resist mask 16c, a first conductive layer 18b and an insulating film 19b are formed, respectively.

Figure 2B:
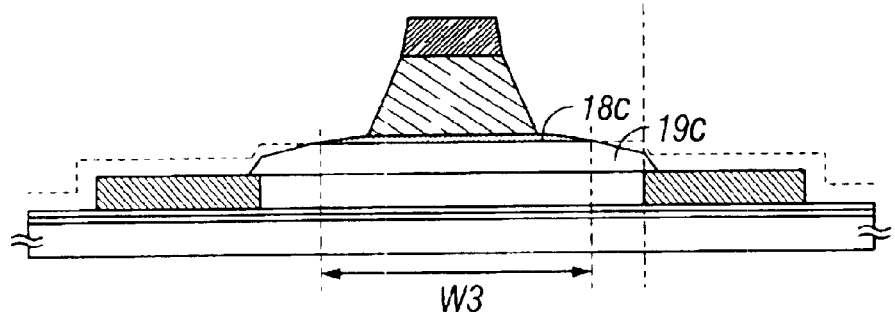

Next, while the resist mask 16c is kept as it is, a fourth etching process is conducted using an RIE etching apparatus or the ICP etching apparatus. By this fourth etching process, a part of a tapered portion of the first conductive layer 18b is removed. Here, the first conductive layer 18b having the first width (W1) becomes a first conductive layer 18c having a third width (W3) (FIG. 2B).

In this embodiment mode, the first conductive layer 18c and the second conductive layer 17c laminated thereon become a gate electrode. Note that, in this fourth etching process, the insulating film 19b is also etched to form an insulating film 19c. Here, although an example in which a part of the insulating film is removed to expose the high concentration impurity regions, the present invention is not particularly limited to this.

Figure 2C:
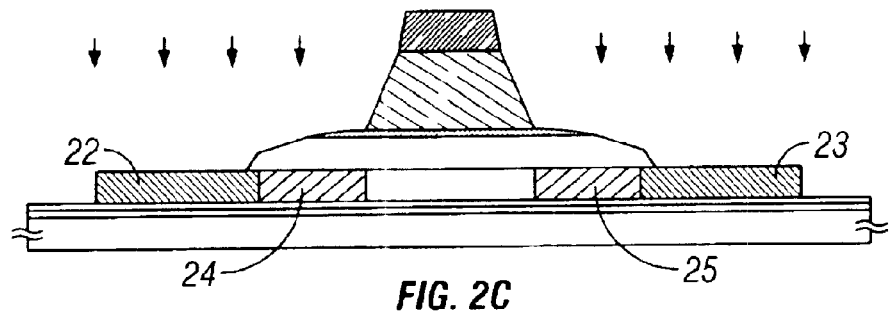

Next, while the resist mask 16c is kept as it is, a second doping process is conducted. By this second doping process, through doping is performed through the tapered portion of the first conductive layer 18b and the insulating film 19b to form low concentration impurity regions 24 and 25 (FIG. 2C). Note that, in this second doping process, the high concentration impurity regions 20 and 21 are also doped to form high concentration impurity regions 22 and 23.

Thereafter, the resist mask 16c is removed, and activation of the impurity element added to the semiconductor layer is performed. Subsequently, after an interlayer insulating film 27 is formed, contact holes that reach the high concentration impurity regions 22 and 23 are formed by using a third mask, and then electrodes 28 and 29 are formed by using a fourth mask.

Figure 2D:
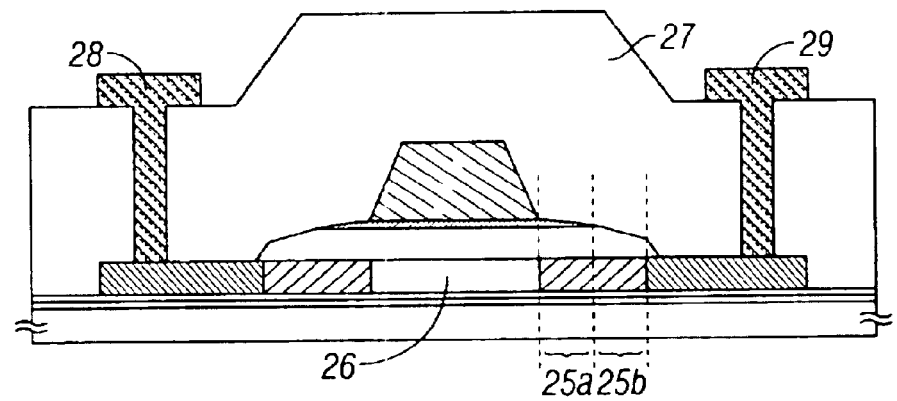

Thus, the TFT having the structure shown in FIG. 2D can be formed with four photo masks.

Further, the characteristic of the TFT formed in accordance with this embodiment mode is that a region 25a overlapping the gate electrode 18c (a GOLD region) and a region 25b not overlapping the gate electrode (an LDD region) are provided in the low concentration impurity region 25 provided between a channel forming region 26 and the drain region 23. Further, the peripheral portions of the insulating film 19c, that is, the regions above the region 25b not overlapping the gate electrode and the high concentration impurity regions 22 and 23 have a tapered shape.

Further, if a plasma doping method is used in the second doping process, the GOLD region 25a is blocked a little by the first conductive layer 18c. Thus, the impurity concentration of the LDD region 25b becomes higher than that of the GOLD region 25a.

[Embodiment Mode 2]

Embodiment Mode 2 of the present invention is explained below with reference to FIGS. 3A to 4D.

Note that this embodiment mode is the same as Embodiment Mode 1 through the second etching process (FIG. 1C), and thus, the same symbols are used. Further, FIGS. 3A to 3C correspond to FIGS. 1A to 1C, respectively.

Figure 3A:
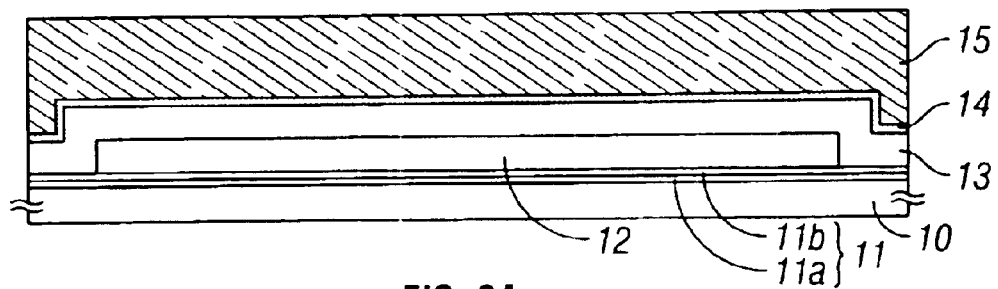
FIGS. 3A to 3D show a manufacturing process of a TFT (Embodiment Mode 2)
Figure 3B:
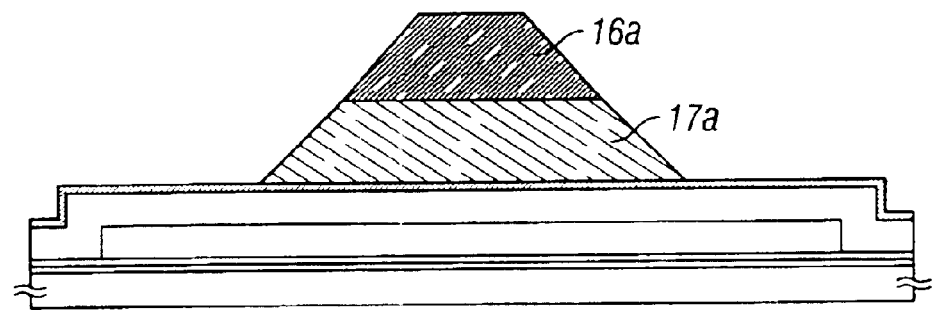
Figure 3C:
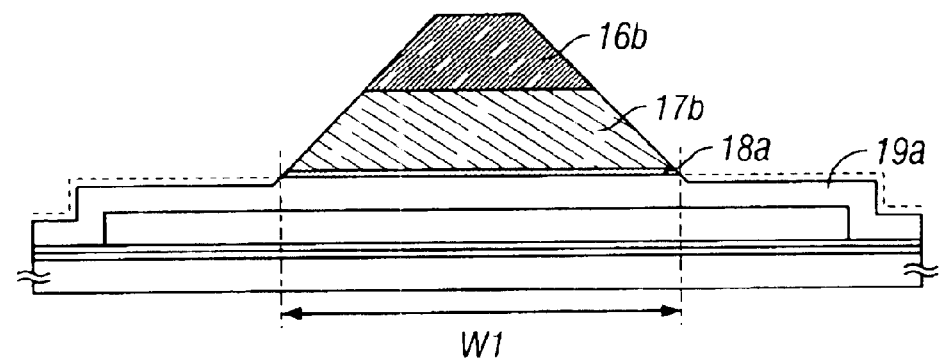

First, the state of FIG. 1C is obtained in accordance with Embodiment Mode 1 (FIG. 3C).

Figure 3D:
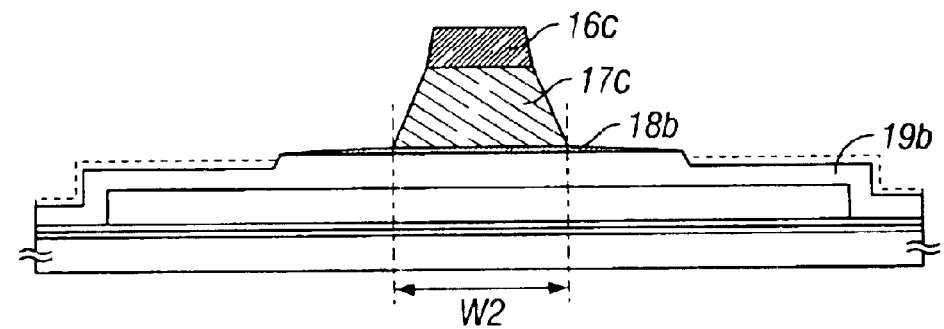

Next, a third etching process is conducted using an ICP etching apparatus by using the resist mask 16b. By this third etching process, the second conductive layer 17b is etched to form the second conductive layer 17c as shown in FIG. 3D. The second conductive layer 17c has the second width (W2). Note that, in this third etching process, the resist mask 16b, the first conductive layer 18a and the insulating film 19a are also etched a little, and the resist mask 16c, the first conductive layer 18b and the insulating film 19b are formed, respectively (FIG. 3D).

Figure 4A:
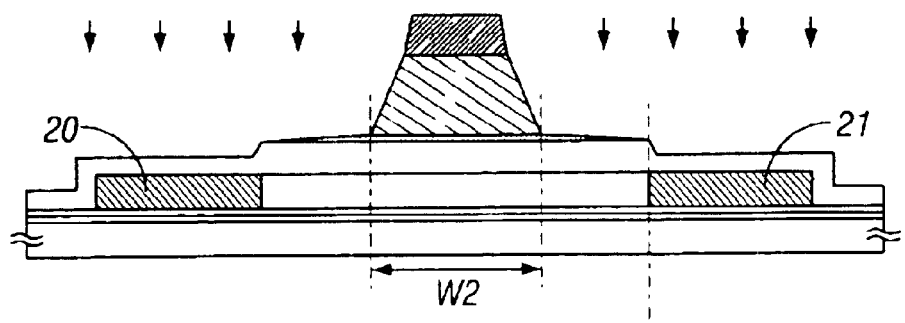
FIGS. 4A to 4D show the manufacturing process of a TFT (Embodiment Mode 2)

Next, while the resist mask 16c is kept as it is, a first doping process is conducted. By this first doping process, through doping is performed through the insulating film 19b to form the high concentration impurity regions 20 and 21 (FIG. 4A).

Figure 4B:
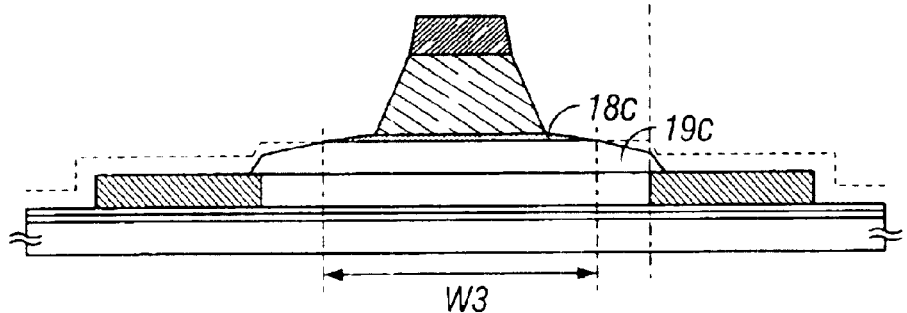

Next, while the resist mask 16c is kept as it is, a fourth etching process is conducted using an RIE etching apparatus or the ICP etching apparatus. By this fourth etching process, a part of the tapered portion of the first conductive layer 18b is removed. Here, the first conductive layer 18b having the first width (W1) becomes the first conductive layer 18c having the third width (W3) (FIG. 4B).

In this embodiment mode, the first conductive layer 18c and the second conductive layer 17c laminated thereon become a gate electrode. Note that, in this fourth etching process, the insulating film 19b is also etched to form the insulating film 19c. Here, although an example in which a part of the insulating film 19b is removed to expose the high concentration impurity regions 20 and 21 is described, the present invention is not particularly limited to this. The high concentration impurity regions 20 and 21 may be covered with a thin insulating film.

Figure 4C:
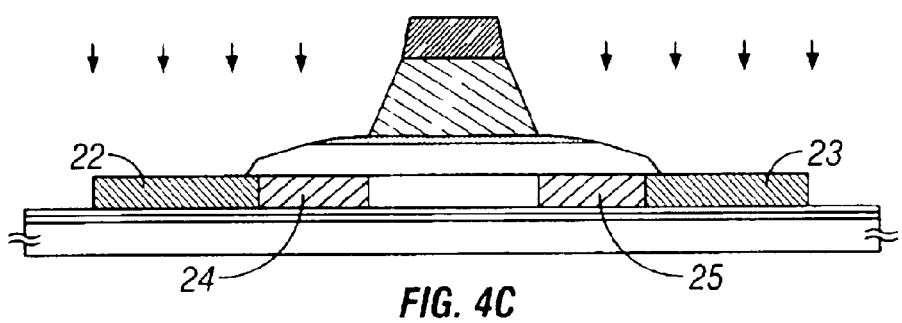

Subsequently, while the resist mask 16c is kept as it is, a second doping process is conducted. By this second doping process, through doping is performed through the tapered portion of the first conductive layer 18b and the insulating film 19b to form the low concentration impurity regions 24 and 25 (FIG. 4C). Note that, in this second doping process, the high concentration impurity regions 20 and 21 are also doped to form the high concentration impurity regions 22 and 23.

Although the second doping process is conducted in order to form the low concentration impurity regions 24 and 25 here, in the first doping process, the low concentration impurity regions may be formed together with the high concentration impurity regions depending on the thickness of the tapered portion of the first conductive layer 18b, the thickness of the insulating film 19b, or the doping condition. In this case, the second doping process becomes unnecessary.

Thereafter, the resist mask 16c is removed, and activation of the impurity element added to the semiconductor layer is performed. Subsequently, after the interlayer insulating film 27 is formed, contact holes that reach the high concentration impurity regions are formed by using the third mask, and then the electrodes 28 and 29 are formed by using the fourth mask.

Figure 4D:
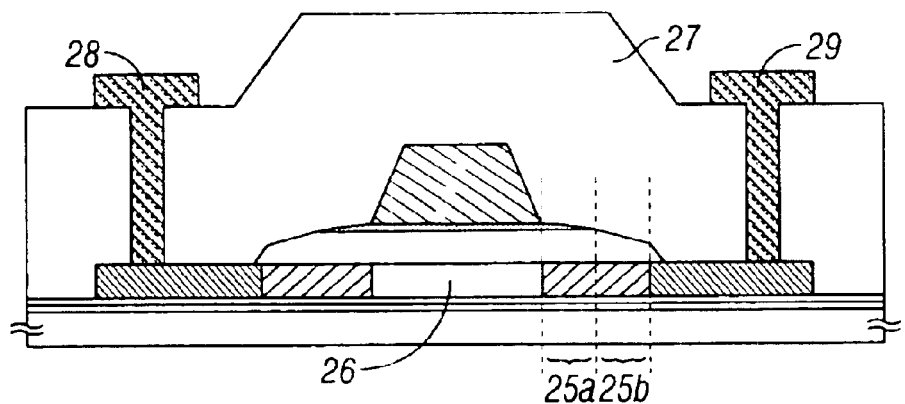

Thus, the TFT having the structure shown in FIG. 4D can be formed with four photo masks.

Further, the characteristic of the TFT formed in accordance with this embodiment mode is that the region 25a overlapping the gate electrode 18c (a GOLD region) and the region 25b not overlapping the gate electrode (an LDD region) are provided in the low concentration impurity region 25 provided between the channel forming region 26 and the drain region 23. Further, the peripheral portions of the insulating film 19c, that is, the regions above the region 25b not overlapping the gate electrode and the high concentration impurity regions 22 and 23 have a tapered shape.

Further, in the second doping process, the GOLD region 25a is blocked a little by the first conductive layer 18c. Thus, the impurity concentration of the LDD region 25b becomes higher than that of the GOLD region 25a.

[Embodiment Mode 3]

Embodiment Mode 3 of the present invention is explained below with reference to FIGS. 5A to 6D.

Note that this embodiment mode is the same as Embodiment Mode 1 through the first etching process (FIG. 1B), and thus, the same symbols are used. Further, FIGS. 5A and 5B correspond to FIGS. 1A and 1B, respectively.

Figure 5A:
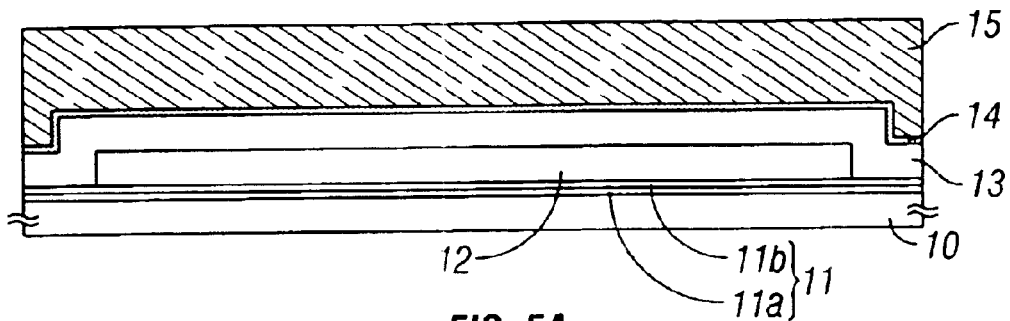
FIGS. 5A to 5D show a manufacturing process of a TFT (Embodiment Mode 3)
Figure 5B:
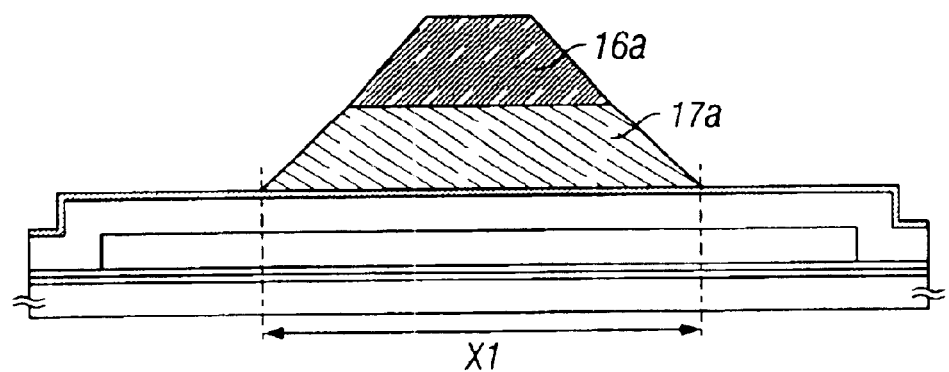

First, the state of FIG. 1B is obtained in accordance with Embodiment Mode 1 (FIG. 5B). Note that the second conductive layer 17a having a first width (X1) is formed by this first etching process.

Figure 5C:
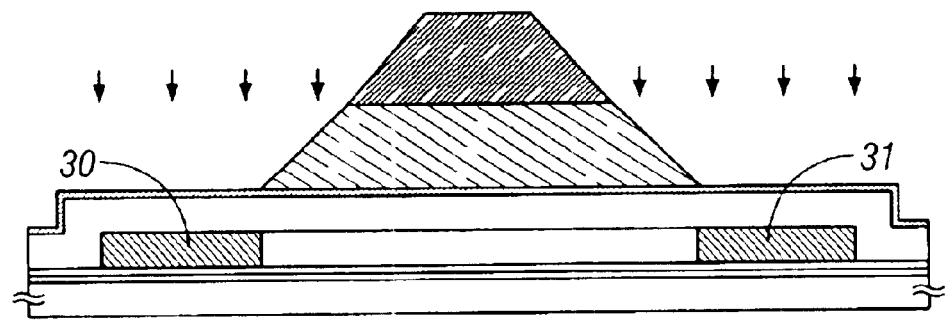

Next, while the resist mask 16a is kept as it is, a first doping process is conducted. By this first doping process, the second conductive layer 17a is made as a mask, and through doping is conducted through the first conductive film 14 and the insulating film 13 to form high concentration impurity regions 30 and 31 (FIG. 5C).

Doping amount doped into the semiconductor layer can be controlled at a desired value by conducting through doping as described above.

Figure 5D:
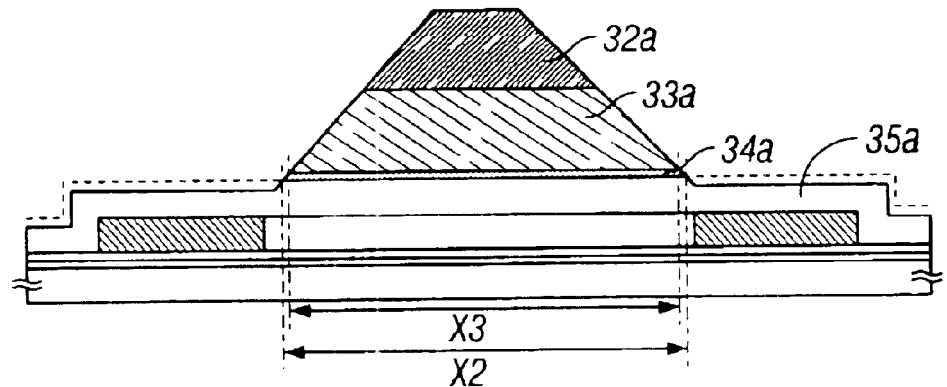

Subsequently, a second etching process is conducted using an ICP etching apparatus by using the resist mask 16a as it is. By this second etching process, the first conductive film 14 is etched to form a first conductive layer 34a as shown in FIG. 5D. The first conductive layer 34a has a second width (X2). Note that in this second etching process, the resist mask 16a, the second conductive layer 17a, and the insulating film 13 are also etched a little, and a resist mask 32a, a second conductive layer 33a having a third width (X3) and an insulating film 35a are formed, respectively.

Figure 6A:
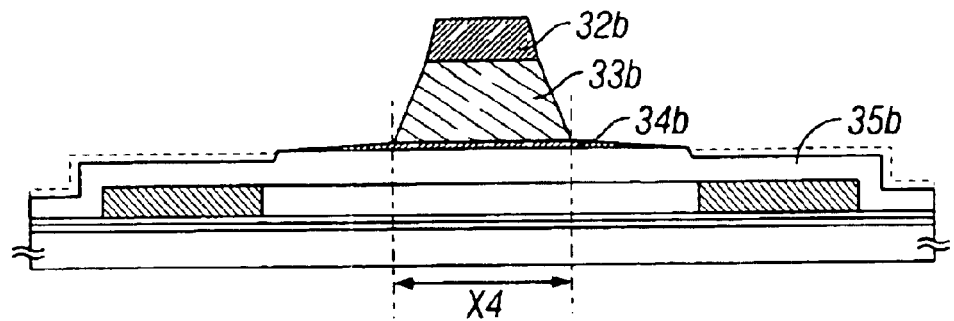
FIGS. 6A to 6D show the manufacturing process of a TFT (Embodiment Mode 3)

Next, a third etching process is conducted using the ICP etching apparatus by using the resist mask 32a. By this third etching process, the second conductive layer 33a is etched to form a second conductive layer 33b as shown in FIG. 6A. The second conductive layer 33b has a fourth width (X4). Note that, in this third etching process, the resist mask 32b, the first conductive layer 34a and the insulating film 35a are also etched a little, and a resist mask 32b, a first conductive layer 34b and an insulating film 35b are formed, respectively (FIG. 6A).

Figure 6B:
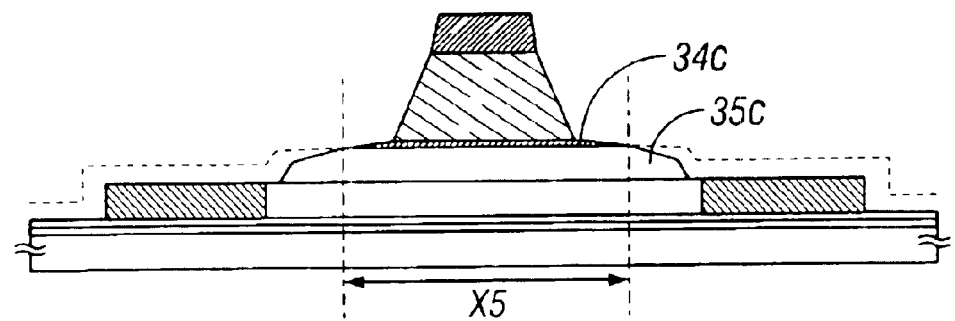

Next, while the resist mask 32b is kept as it is, a fourth etching process is conducted using an RIE etching apparatus or the ICP etching apparatus. By this fourth etching process, a part of a tapered portion of the first conductive layer 34b is removed. Here, the first conductive layer 34b having the second width (X2) becomes a first conductive layer 34c having a fifth width (X5) (FIG. 6B).

In this embodiment mode, the first conductive layer 34c and the second conductive layer 33b laminated thereon become a gate electrode. Note that, in this fourth etching process, the insulating film 35b is also etched to form an insulating film 35c. Here, although an example in which a part of the insulating film 35b is removed to expose the high concentration impurity regions 30 and 31 is described, the present invention is not particularly limited to this. The high concentration impurity regions 30 and 31 may be covered with a thin insulating film.

Figure 6C:
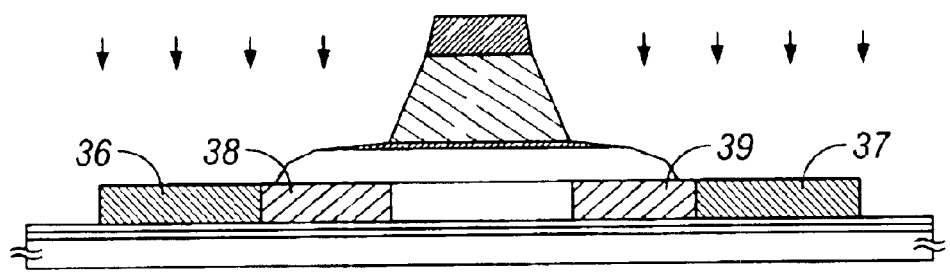

Next, while the resist mask 32b is kept as it is, a second doping process is conducted. By this second doping process, through doping is performed through the tapered portion of the first conductive layer 34b and the insulating film 35b to form low concentration impurity regions 38 and 39 (FIG. 6C). Note that, in this second doping process, the high concentration impurity regions 30 and 31 are also doped to form high concentration impurity regions 36 and 37.

Thereafter, the resist mask 32b is removed, and activation of the impurity element added to the semiconductor layer is performed. Subsequently, after an interlayer insulating film 41 is formed, contact holes that reach the high concentration impurity regions are formed by using the third mask. Then, after a conductive film is formed, electrodes 42 and 43 are formed by using the fourth mask.

Figure 6D:
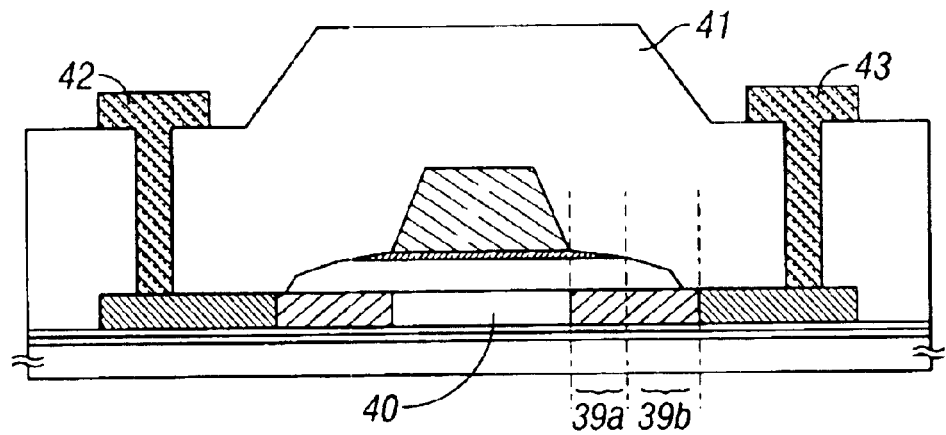

Thus, the TFT having the structure shown in FIG. 6D can be formed with four photo masks.

Further, the characteristic of the TFT formed in accordance with this embodiment mode is that a region 39a overlapping the gate electrode (33b and 34c) (a GOLD region) and a region 39b not overlapping the gate electrode (an LDD region) are provided in the low concentration impurity region 39 provided between a channel forming region 40 and the drain region 37. Further, the peripheral portions of the insulating film 35c, that is, the regions above the region 39b not overlapping the gate electrode and the high concentration impurity regions 36 and 37 have a tapered shape.

Further, in the second doping process, the GOLD region 39a is blocked a little by the first conductive layer 34b. Thus, the impurity concentration of the LDD region 39b becomes higher than that of the GOLD region 39a.

[Embodiment Mode 4]

Embodiment Mode 4 of the present invention is explained below with reference to FIGS. 7A to 8C.

Note that this embodiment mode is the same as Embodiment Mode 3 through the first doping process (FIG. 5C), and thus, the explanation is omitted. Here, the same symbols as in FIGS. 5A to 5D are used for explanation. Further, FIGS. 7A to 7C correspond to FIGS. 5A to 5C, respectively.

Figure 7A:
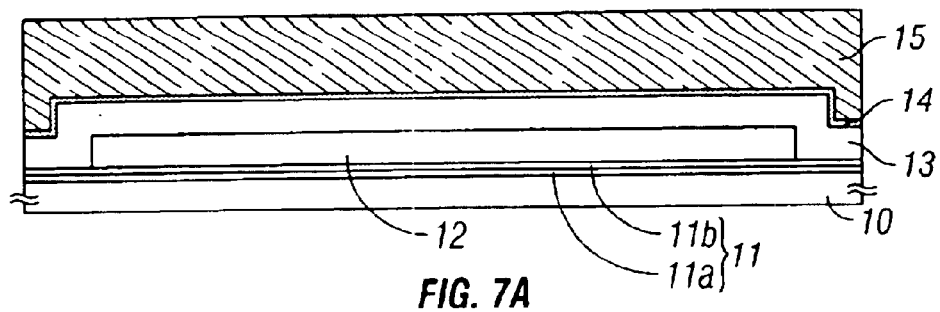
FIGS. 7A to 7D show a manufacturing process of a TFT (Embodiment Mode 4)
Figure 7B:
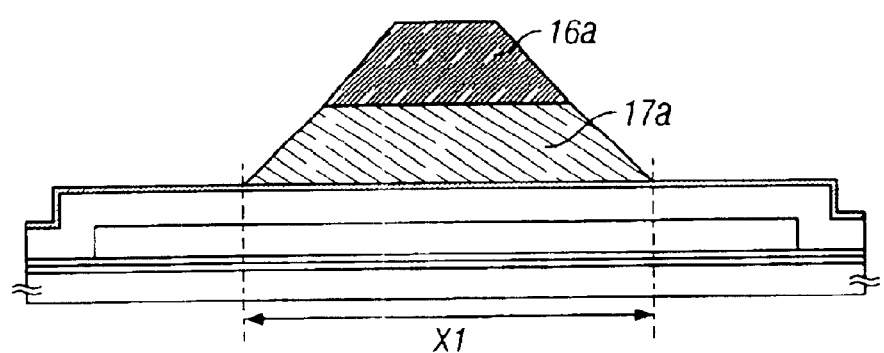
Figure 7C:
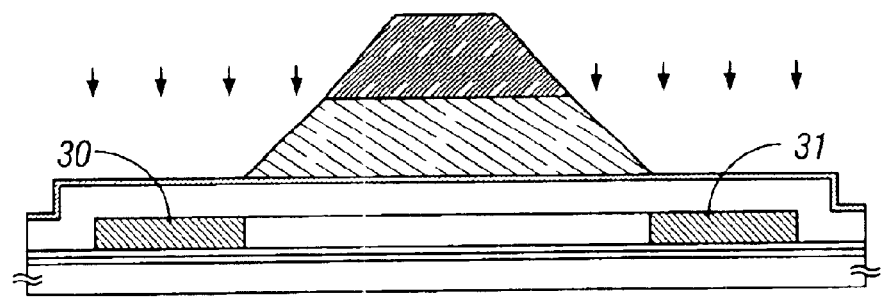

First, the state of FIG. 5C is obtained in accordance with Embodiment Mode 1 (FIG. 7C).

Figure 7D:
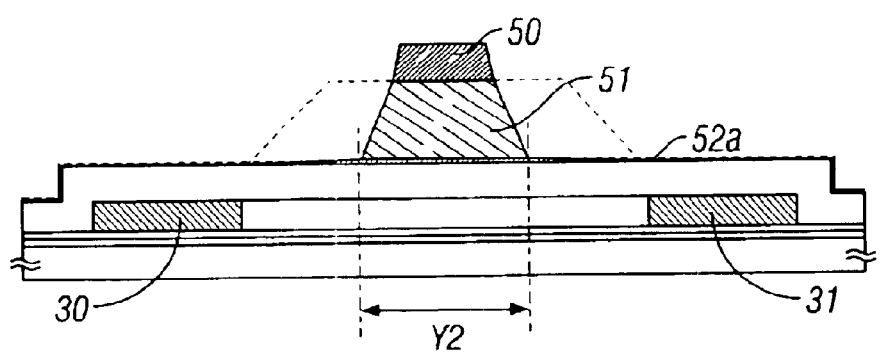

Subsequently, a second etching process is conducted using an ICP etching apparatus by using the resist mask 16a. By this second etching process, the second conductive layer 17a is etched to form a second conductive layer 51 as shown in FIG. 7D. The second conductive layer 51 has a second width (Y2). Note that, in this second etching process, the resist mask and the first conductive film are also etched a little, and a resist mask 50 and a first conductive film 52a are formed, respectively (FIG. 7D). Note that a part of the first conductive film 52a has already been etched in the first etching process, and therefore, the part is further thinned by this second etching process. Further, the portion of the first conductive film 52a not overlapping the second conductive layer 51, which has not been etched in the first etching process, has a tapered shape.

Figure 8A:
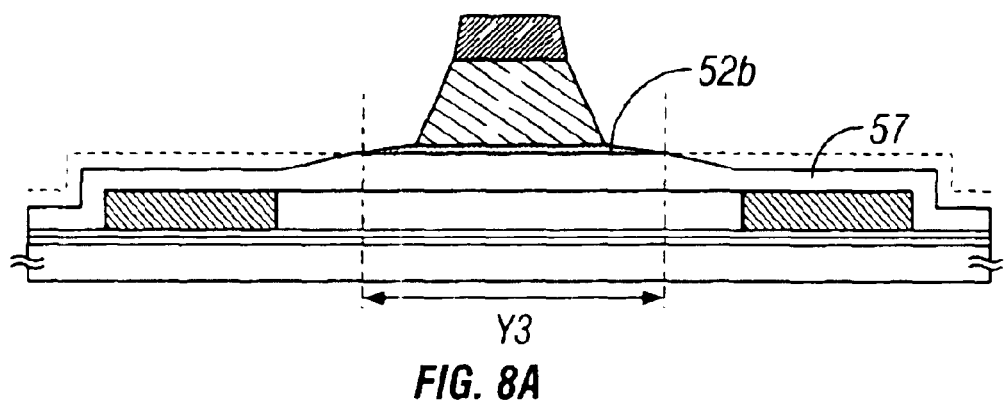
FIGS. 8A to 8C show the manufacturing process of a TFT (Embodiment Mode 4)

Next, while the resist mask 50 is kept as it is, a third etching process is conducted using an RIE etching apparatus or the ICP etching apparatus. By this third etching process, the portion thinned through the first etching process and a part of the tapered portion of the exposed first conductive film 52a are removed. Here, the etching condition is appropriately controlled while considering the thickness of the first conductive film 52a, the thickness of the insulating film 13 and the like, whereby a first conductive layer 52b having a tapered shape and also a third width (Y3) is formed (FIG. 8A).

In this embodiment mode, the first conductive layer 52b and the second conductive layer 51 laminated thereon become a gate electrode. Note that, in this third etching process, the insulating film 13 is also etched to form an insulating film 57.

Figure 8B:
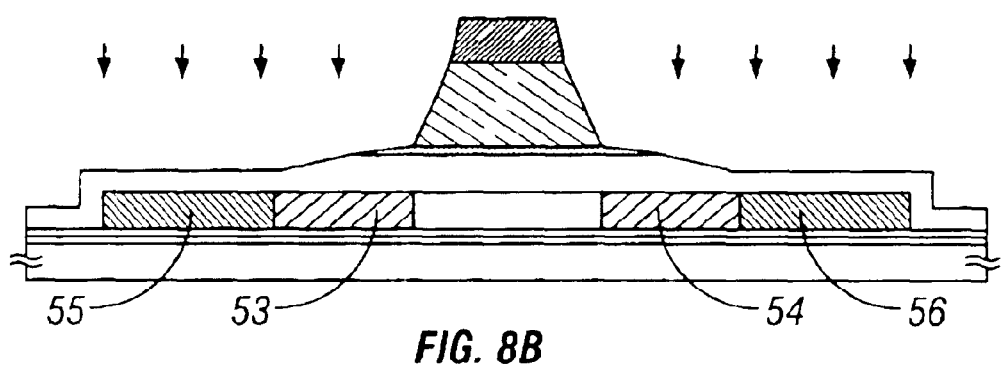

Next, while the resist mask 50 is kept as it is, a second doping process is conducted. By this second doping process, through doping is conducted through the tapered portion of the first conductive film 52a and the insulating film 13 to form low concentration impurity regions 53 and 54 (FIG. 8B). Note that, in this second doping process, the high concentration impurity regions 30 and 31 are also doped to form high concentration impurity regions 55 and 56.

Doping amount doped into the semiconductor layer can be controlled at a desired value by conducting through doping as described above.

Thereafter, the resist mask 50 is removed, and activation of the impurity element added to the semiconductor layer is performed. Subsequently, after an interlayer insulating film 59 is formed, contact holes that reach the high concentration impurity regions 55 and 56 are formed by using the third mask. Then, after a conductive film is formed, electrodes 60 and 61 are formed by using the fourth mask.

Figure 8C:
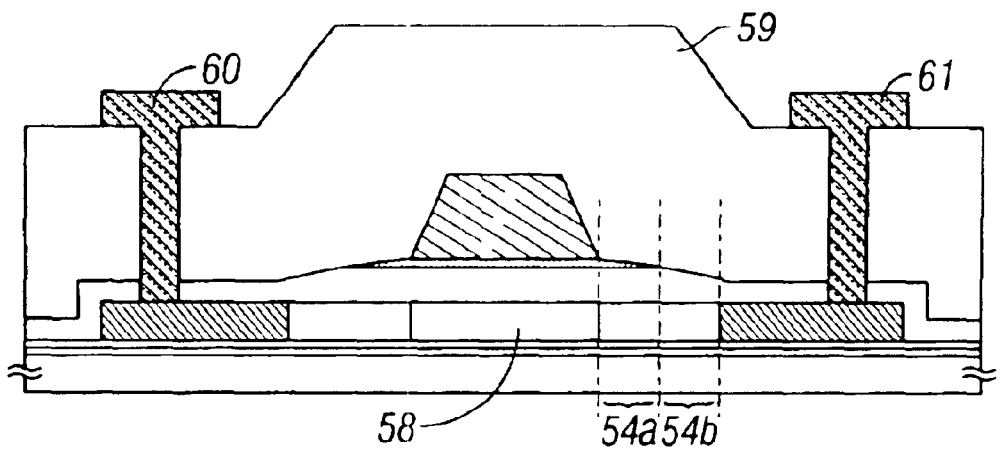

Thus, the TFT having the structure shown in FIG. 8C can be formed with four photo masks.

Further, the characteristic of the TFT formed in accordance with this embodiment mode is that a region 54a overlapping the gate electrode (51 and 52b) (a GOLD region) and a region 54b not overlapping the gate electrode (an LDD region) are provided in the low concentration impurity region 54 provided between a channel forming region 58 and the drain region 56.

Further, in the second doping process, the GOLD region 54a is blocked a little by the first conductive layer 52b. Thus, the impurity concentration of the LDD region 54b becomes higher than that of the GOLD region 54a.

[Embodiment Mode 5]

Embodiment Mode 5 of the present invention is explained below with reference to FIGS. 9A to 10B.

Note that this embodiment mode is the same as Embodiment Mode 3 through the first doping process (FIG. 5C), and thus, the explanation is omitted. Here, the same symbols as in FIGS. 5A to 5D are used for explanation. Further, FIGS. 9A to 9C correspond to FIGS. 5A to 5C, respectively.

Figure 9A:
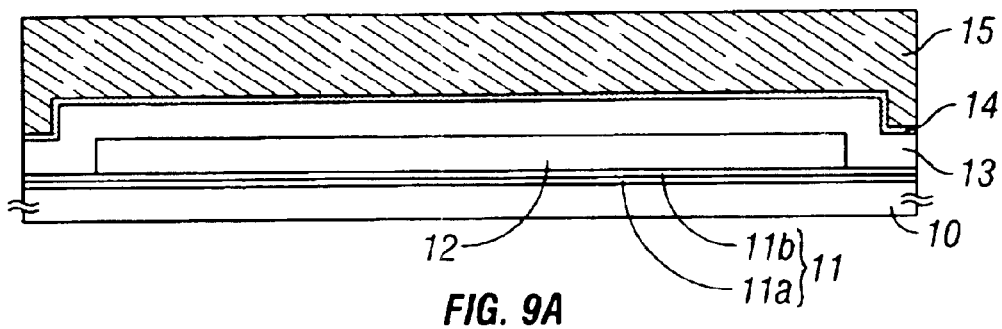
FIGS. 9A to 9D show a manufacturing process of a TFT (Embodiment Mode 5)
Figure 9B:
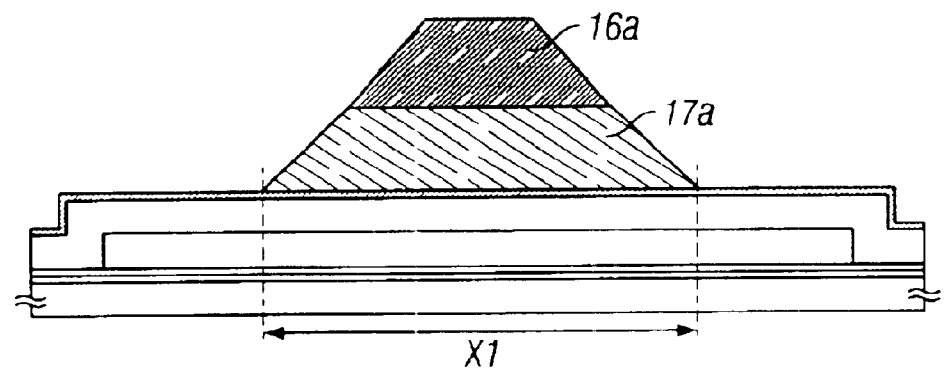
Figure 9C:
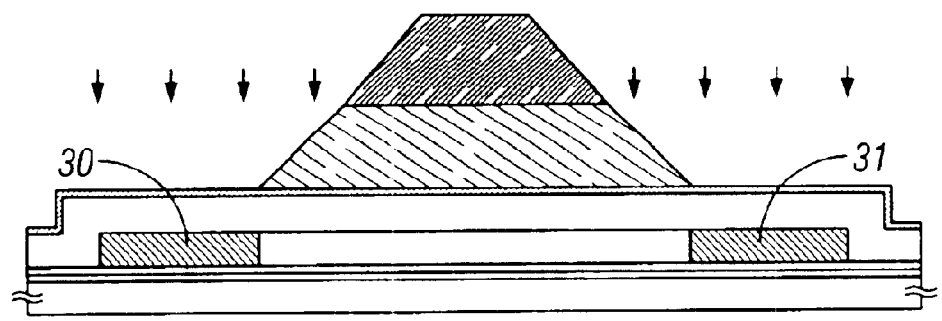

First, the state of FIG. 5C is obtained in accordance with Embodiment Mode 1 (FIG. 9C).

Subsequently, a second etching process is conducted using an ICP etching apparatus by using the resist mask 16a. An example in which the first conductive film is left on the entire surface is described in Embodiment Mode 4. However, in this embodiment mode, the first conductive film not covered with the second conductive layer 17a is removed in the second etching process.

Figure 9D:
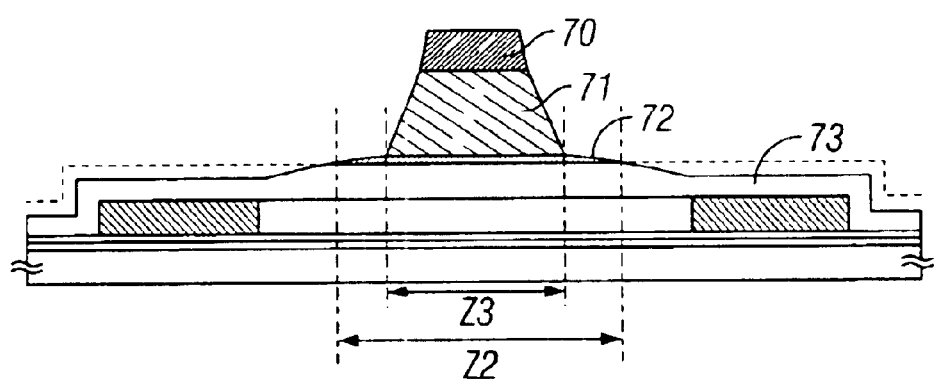

By this second etching process, the second conductive layer 17a and the first conductive film 14 are etched to form a second conductive layer 71 and a first conductive layer 72 as shown in FIG. 9D. The first conductive layer 72 has a second width (Z2), and the second conductive layer 71 has a third width (Z3). Note that, in this second etching process, the resist mask and the insulating film 13 are also etched a little, and a resist mask 70 and an insulating film 73 are formed, respectively (FIG. 9D).

In this embodiment mode, the first conductive layer 72 and the second conductive layer 71 laminated thereon become a gate electrode.

Figure 10A:
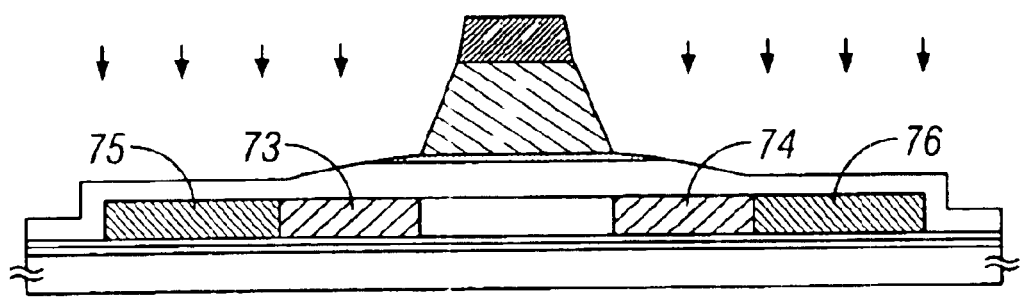
FIGS. 10A and 10B show the manufacturing process of a TFT (Embodiment Mode 5)

Next, while the resist mask 70 is kept as it is, a second doping process is conducted. By this second doping process, through doping is conducted through a tapered portion of the first conductive layer 72 and the insulating film 13 to form low concentration impurity regions 73 and 74 (FIG. 10A). Note that, in this second doping process, the high concentration impurity regions 30 and 31 are also doped to form high concentration impurity regions 75 and 76.

Doping amount doped into the semiconductor layer can be controlled at a desired value by conducting through doping as described above.

Thereafter, the resist mask 70 is removed, and activation of the impurity element added to the semiconductor layer is performed. Subsequently, after an interlayer insulating film 79 is formed, contact holes that reach the high concentration impurity regions 75 and 76 are formed by using the third mask. Then, after a conductive film is formed, electrodes 80 and 81 are formed by using the fourth mask.

Figure 10B:
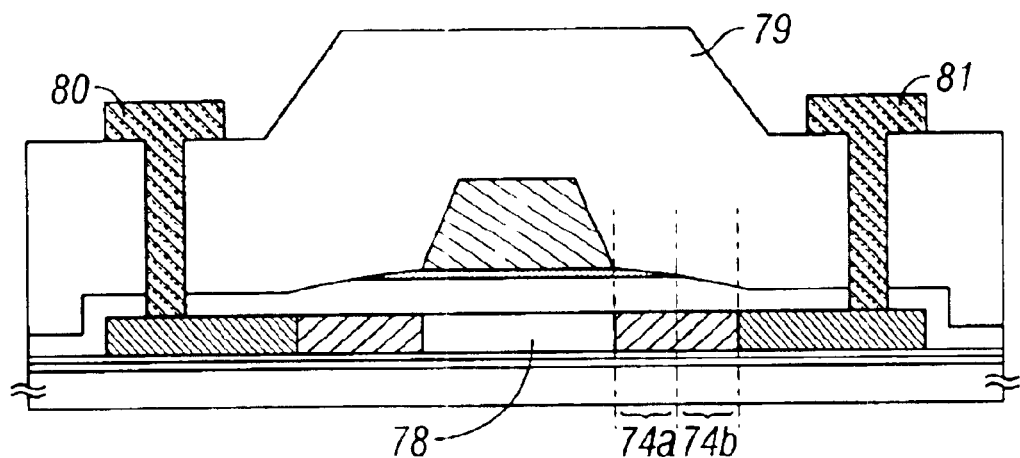

Thus, the TFT having the structure shown in FIG. 10B can be formed with four photo masks.

Further, the characteristic of the TFT formed in accordance with this embodiment mode is that a region 74a overlapping the gate electrode (71 and 72) (a GOLD region) and a region 74b not overlapping the gate electrode (an LDD region) are provided in the low concentration impurity region 74 provided between a channel forming region 78 and the drain region 76.

Further, in the second doping process, the GOLD region 74a is blocked a little by the first conductive layer 72. Thus, the impurity concentration of the LDD region 74b becomes higher than that of the GOLD region 74a.

The present invention with the structure described above is further explained in detail in accordance with embodiments described below.

[Embodiment 1]

A method of manufacturing a pixel portion and a TFT of a driver circuit provided in the vicinity of the pixel portion (an n-channel TFT and a p-channel TFT) on the same substrate simultaneously is described in detail with reference to FIGS. 11A to 13.

First, in this embodiment, a substrate 100 formed of glass such as barium borosilicate glass or aluminum borosilicate, represented by Corning #7059 glass and #1737 glass is prepared. Note that, as the substrate 100, a quartz substrate may be used as long as the substrate is a light transmission type. A plastic substrate having heat resistance to a process temperature of this embodiment may also be used.

Then, a base film 101 is formed from an insulating film such as a silicon oxide film, a silicon nitride film or a silicon oxynitride film, on the substrate 100. In this embodiment, a two-layer structure is used for the base film 101. However, a single-layer film or a lamination film consisting of two or more layers of the insulating film may be used. As a first layer of the base film 101, a silicon oxynitride film 101a is formed with a thickness of 10 to 200 nm (preferably 50 to 100 nm) using $SiH_4$, $NH_3$, and $N_2O$ as reaction gases by plasma CVD. In this embodiment, the silicon oxynitride film 101a (composition ratio Si=32%, O=27%, N=24% and H=17%) having a film thickness of 50 nm is formed. Then, as a second layer of the base film 101, a silicon oxynitride film 101b is formed so as to laminate thereon with a thickness of 50 to 200 nm (preferably 100 to 150 nm) using $SiH_4$ and $N_2O$ as reaction gases by plasma CVD. In this embodiment, the silicon oxynitride film 101b (composition ratio Si=32%, O=59%, N=7% and H=2%) having a film thickness of 100 nm is formed.

Subsequently, semiconductor layers 102 to 105 are formed on the base film. The semiconductor layers 102 to 105 are formed such that a semiconductor film having an amorphous structure is formed by a known method (a sputtering method, an LPCVD method, or a plasma CVD method), and is subjected to a known crystallization process (a laser crystallization method, a thermal crystallization method, or a thermal crystallization method using a catalyst such as nickel and the like), and the crystalline semiconductor film thus obtained is patterned into desired shapes. The semiconductor layers 102 to 105 are formed with a thickness of 25 to 80 nm (preferably 30 to 60 nm). The material of the crystalline semiconductor film is not particularly limited, but it is preferable to form the film using silicon, a silicon germanium ($Si_xGe_{1-x}$(0<X<1, typically X=0.0001 to 0.05)) alloy, or the like. When forming the silicon germanium, it may be formed by a plasma CVD method using a mixture gas of silane and germanium, by ion injection of germanium into the silicon film, or by a sputtering method using a target formed of silicon germanium. In this embodiment, after forming an amorphous silicon film with a thickness of 55 nm by plasma CVD, a nickel-containing solution is maintained on the amorphous silicon film. A dehydrogenation process of the amorphous silicon film is performed (500° C. for one hour), and thereafter a thermal crystallization process is performed (550° C. for four hours) thereto. Further, to improve the crystallinity thereof, laser annealing process is performed to form the crystalline silicon film. Then, this crystalline silicon film is subjected to a patterning process using a photolithography method, to thereby form the semiconductor layers 102 to 105.

Further, after the formation of the semiconductor layers 102 to 105, doping (also referred to as channel doping) of a minute amount of an impurity element (boron or phosphorus) may be conducted to control a threshold of the TFT.

Besides, in the case where the crystalline semiconductor film is manufactured by the laser crystallization method, a pulse oscillation type or continuous-emission type excimer laser, YAG laser, or $YVO_4$ laser may be used. In the case where those lasers are used, it is appropriate to use a method in which laser light radiated from a laser oscillator is converged into a linear shape by an optical system, and is irradiated onto the semiconductor film. Although the conditions of the crystallization should be properly selected by an operator, in the case where the excimer laser is used, a pulse oscillation frequency is set to 30 Hz, and a laser energy density is set to 100 to 400 $mJ/cm^2$ (typically 200 to 300 $mJ/cm^2$). Further, in the case where the YAG laser is used, it is appropriate that the second harmonic is used to set a pulse oscillation frequency to 1 to 10 kHz, and a laser energy density to 300 to 600 $mJ/cm^2$ (typically, 350 to 500 $mJ/cm^2$). Then, laser light converged into a linear shape with a width of 100 to 1000 $\mu$m, for example, 400 $\mu$m is irradiated to the entire surface of the substrate, and an overlapping ratio (overlap ratio) of the linear laser light at this time may be set to 80 to 98%.

A gate insulating film 106 is then formed to cover the semiconductor layers 102 to 105. Before forming the gate insulating film, it is preferable to wash the surface of the semiconductor layer. For the removal of the contaminated impurity on the surface of the film (typically C, Na and the like), an acid solution including fluorine may be used to perform etching of the surface of the film to be very thin, after washing it with pure water containing ozone. As a method of performing etching to obtain the ultra-thin film, a method of using a spinning device to spin the substrate, and splashing the acid solution containing fluorine which is in contact with the surface of the film, is effective. As an acid solution containing fluorine, hydrofluoric acid, dilute hydrofluoric acid, ammonium fluoride, buff hydrofluoric acid (a mixed solution of hydrofluoric acid and ammonium fluoride), a mixed solution of hydrofluoric acid and hydrogen peroxide, and the like may be used. After washing, the gate insulating film 106 is successively formed from an insulating film containing silicon by plasma CVD or sputtering into a film thickness of 40 to 150 nm, preferably 50 to 100 nm. In this embodiment, the gate insulating film 106 is formed from a silicon oxynitride film into a thickness of 110 nm by plasma CVD (composition ratio Si=32%, O=59%, N=7%, and H=2%). Of course, the gate insulating film is not limited to the silicon oxynitride film, and other insulating film containing silicon may be formed into a single layer or a lamination structure.

Besides, when the silicon oxide film is used, it can be formed by plasma CVD in which TEOS (tetraethyl orthosilicate) and $O_2$ are mixed, with a reaction pressure of 40 Pa, a substrate temperature of 300 to 400° C. and discharged at a high frequency (13.56 MHz) power density of 0.5 to 0.8 W/cm$^2$. Good characteristics of the gate insulating film can be obtained in the silicon oxide film thus manufactured by subsequent thermal annealing at 400 to 500° C.

Then, as shown in FIG. 11A, on the gate insulating film 106, a first conductive film 107 with a film thickness of 20 to 100 nm and a second conductive film 108 with a film thickness of 100 to 400 nm are formed into a lamination. Further, to prevent contamination, it is preferable that the gate insulating film and the first conductive film and the second conductive film are continuously formed without exposure to the atmosphere. Further, in the case the films are not formed sequentially, if a film forming apparatus accompanied with a washing machine is used for film formation, contamination at the boundary of the films may be prevented. The washing method may be performed similar to that performed before the formation of the gate insulating film. In this embodiment, the first conductive film 107 made of a TaN film with a film thickness of 30 nm, and the second conductive film 108 made of a W film with a film thickness of 370 nm are formed continuously. The TaN film is formed by sputtering with a Ta target under a nitrogen containing atmosphere. Further, the W film is formed by the sputtering method with a W target. The W film may also be formed by a thermal CVD method using tungsten hexafluoride ($WF_6$). Whichever method is used, it is necessary to make the material have low resistance for use as the gate electrode, and it is preferred that the resistivity of the W film is set to 20 $\mu\Omega$cm or less. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by sputtering using a W target of high purity (purity of 99.9999%), and in addition, by taking sufficient consideration to prevent impurities within the gas phase from mixing therein during the film formation, a resistivity of from 9 to 20 $\mu\Omega$cm can be realized.

Note that, in this embodiment, the first conductive film 107 is made of TaN, and the second conductive film 108 is made of W, but the material is not particularly limited thereto, and either film may be formed of an element selected from the group consisting of Ta, W, Ti, Mo, Al, Cu, Cr and Nd, or an alloy material or a compound material containing the above element as its main constituent. Further, a semiconductor film typified by a polycrystalline silicon film doped with an impurity element such as phosphorus may be used. Further, an AgPdCu alloy may be used. A combination may be employed such as a combination of the first conductive film formed of a tantalum (Ta) film and the second conductive film formed of a W film, a combination of the first conductive film formed of a titanium nitride (TiN) film and the second conductive film formed of a W film, a combination of the first conductive film formed of a tantalum nitride (TaN) film and the second conductive film formed of an Al film, or a combination of the first conductive film formed of a tantalum nitride (TaN) film and the second conductive film formed of a Cu film.

Next, masks 109 to 112 consisting of resist are formed by using a photolithography method, and a first etching process for forming electrodes and wirings is carried out. In the first etching process, the first and the second etching conditions are used. In this embodiment, as the first etching conditions, an ICP (inductively coupled plasma) etching method is used, in which $CF_4$, $Cl_2$ and $O_2$ are used as the etching gases, a gas flowing rate of each gas is set as 25/25/10 (sccm), and an RF (13.56 MHz) power of 500 W is applied to a coil type electrode under a pressure of 1 Pa to generate plasma. Thus the etching is performed. A dry etching apparatus using ICP of Matsushita Electric Industrial Co., Ltd. (Model E645-□ICP) is used. An RF (13.56 MHz) power of 150 W is also applied to the side of the substrate (sample stage) and a substantially negative self bias voltage is applied thereto. Based on this first etching condition, the W film is etched to make an end portion of the first conductive layer into a tapered shape. Under the first etching condition, the etching speed to the W film is 200.39 nm/min, the etching speed to the TaN film is 80.32 nm/min, and the selection ratio of W in respect to TaN is approximately 2.5. Further, under the first etching condition, the taper angle of the W film is approximately 26°. Note that, etching under the first etching condition here corresponds to the first etching process (FIG. 1B) described in Embodiment Mode 1

Thereafter, the etching condition is changed into a second etching condition without removing the masks 109 to 112 consisting of resist, and the etching is performed such that $CF_4$ and $Cl_2$ are used as the etching gases, a gas flowing rate of each gas is set as 30/30 (sccm), and an RF (13.56 MHz) power of 500 W is applied to a coil type electrode under a pressure of 1 Pa to generate plasma. The etching is performed for about 30 seconds. An RF (13.56 MHz) power of 20 W is also applied to the side of the substrate (sample stage) and a substantially negative self bias voltage is applied thereto. In the second etching condition, in which $CF_4$ and $Cl_2$ are mixed, the W film and the TaN film are etched at the same degree. Under the second etching condition, the etching speed to the W film is 58.97 nm/min, and the etching speed to the TaN film is 66.43 nm/min. Note that, in order to perform etching without leaving a residue on the gate insulating film, it is appropriate that an etching time is increased at a rate on the order of 10 to 20%. Note that, the etching under the second etching condition here corresponds to the second etching process (FIG. 1C) described in Embodiment Mode 1.

In the above first etching process, by making the shapes of the masks consisting of resist suitable, the end portions of the first conductive layer and the second conductive layer become the tapered shape by the effect of the bias voltage applied to the substrate side. The tangle of the taper portion may be 15 to 45°. In this way, first shape conductive layers 113 to 116 consisting of the first conductive layers and the second conductive layers (the first conductive layers 113a to 116a and the second conductive layers 113b to 116b) are formed by the first etching process. The width of the first conductive layer in the channel length direction corresponds to W1 shown in Embodiment Mode 1. Note that, a "width" refers to the width of the cross section where the conductive layer is cut in the channel length direction, and in a case the cross section shape in the channel length direction is trapezoidal as shown in FIGS. 11A to 11D, the "width" refers to the length of the lower side of the trapezoid. Reference numeral 117 denotes a gate insulating film, and regions which are not covered with the first shape conductive layers 113 to 116 are etched by about 20 to 50 nm so that thinned regions are formed.

Then, a first doping process is performed without removing the masks consisting of resist, and an impurity element that imparts an n-type is added to the semiconductor layer (FIG. 11B). Doping may be performed by an ion doping method or an ion implanting method. The condition of the ion doping method is such that a dosage is $1\times10^{13}$ to $5\times10^{15}$ atoms/cm$^2$, and an acceleration voltage is 60 to 100 keV. In this embodiment, the dosage is set to $1.5\times10^{15}$ atoms/cm$^2$, and the acceleration voltage is set to 80 keV. As the impurity element imparting the n-type, an element belonging to group 15, typically phosphorus (P) or arsenic (As) may be used, but phosphorus is used here. In this case, the conductive layers 113 to 116 become masks to the impurity element imparting the n-type, and high concentration impurity regions 118 to 121 are formed in a self-aligning manner. The impurity element imparting the n-type in the concentration range of $1\times10^{20}$ to $1\times10^{21}$ atoms/cm$^3$ is added to the high concentration impurity regions 118 to 121. Note that, the first doping process here corresponds to the first doping process described in Embodiment Mode 1 (FIG. 1D).

Next, a second etching process is performed without removing the masks consisting of resist (FIG. 11C). In the second etching process, $CF_4$, $Cl_2$ and $O_2$ are used as the etching gases, a gas flowing rate of each gas is set to 25/25/10 (sccm), and an RF (13.56 MHz) power of 500 W is applied to a coil type electrode under a pressure of 1 Pa to generate plasma. Thus, the etching is performed. An RF (13.56 MHz) power of 20 W is applied to the side of the substrate (sample stage), and a substantially negative self bias voltage is applied thereto. In the second etching process, the etching speed to the W film is 124.62 nm/min, the etching speed to the TaN film is 20.67 nm/min, and the selection ratio of W in respect to TaN is approximately 6.05. Accordingly, the W film is selectively etched. The taper angle of the W film is 70°. By the second etching process, second conductive layers 122b to 125b are formed. On the other hand, the first conductive layers 113a to 116a are hardly etched to form first conductive layers 122a to 125a. Note that, the second etching process corresponds to the third etching process described in Embodiment Mode 1 (FIG. 2A). Further, the width of the second conductive layer in the channel length direction corresponds to W2 indicated in Embodiment Mode 1.

Next, a third etching process is performed without removing the masks consisting of resist. In the third etching process, the taper portion of the first conductive layer is partially etched to reduce the region overlapping the semiconductor layer. In the third etching process, $CHF_3$ is used as an etching gas to perform a reactive ion etching method (RIE method). In this embodiment, the third etching process is performed with a gas flowing rate of $CHF_3$ of 35 sccm, an RF power of 800 W, and a chamber pressure of 6.7 Pa. By the third etching process, the first conductive layers 138 to 142 are formed (FIG. 11D). Note that, the third etching process here corresponds to the fourth etching process described in Embodiment Mode 1 (FIG. 2B). Further, the width of the first conductive layer in the channel length direction corresponds to W3 indicated in Embodiment Mode 1.

At the time of the third etching process, the insulating film 117 is etched at the same time, and a portion of high concentration impurity regions 130 to 133 is exposed, to form insulating films 143a to 143c and 144. Note that, in this embodiment, an etching condition where the portion of the high concentration impurity regions 130 to 133 is exposed is used, but by changing the thickness of the insulating film and the etching condition, a thin insulating film may be made to remain in the high concentration impurity regions.

Further, the electrode formed by the first conductive layer 138 and the second conductive layer 122b becomes a gate electrode of an n-channel TFT of a driver circuit to be formed later, and the electrode formed by the first conductive layer 139 and the second conductive layer 123b becomes a gate electrode of a p-channel TFT of the driver circuit to be formed later. At the same time, the electrode formed by the first conductive layer 140 and the second conductive layer 124b becomes a gate electrode of an n-channel TFT of a pixel portion to be formed later, and the electrode formed by the first conductive layer 141 and the second conductive layer 125b becomes one of the electrodes of a storage capacitance of the pixel portion to be formed later.

Figure 12A:
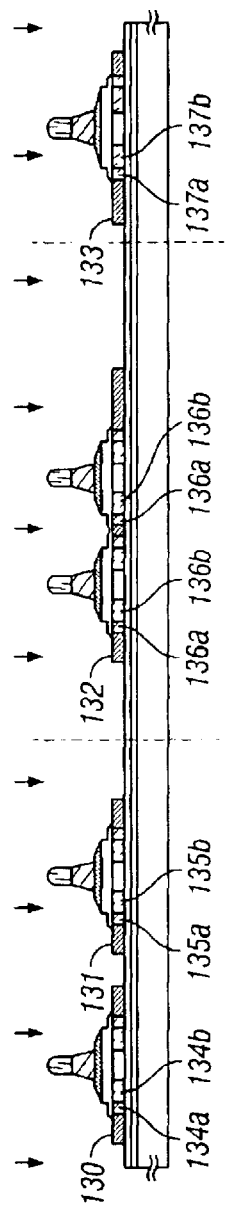
FIGS. 12A to 12D show the manufacturing process of an AM-LCD (Embodiment 1)

By performing the second doping process, the state as shown in FIG. 12A is obtained. Doping is performed by using the second conductive layers 122b to 125b as masks to an impurity, and by using a plasma doping method or an ion implantation method so that an impurity element is added to the semiconductor layer at the lower portion of the taper portion of the first conductive layer. In this embodiment, P (phosphorus) is used as an impurity element, and plasma doping is performed with a dosage of $3.5\times10^{12}$ atoms/cm$^2$ and an accelerating voltage of 90 keV. Thus, low concentration impurity regions 126 to 129 which overlap with the first conductive layer are formed in a self-aligning manner. The concentration of phosphorus (P) added to the low concentration impurity regions 126 to 129 is $1\times10^{17}$ to $1\times10^{18}$ atoms/cm$^3$. Note that, in the semiconductor layer that overlaps with the taper portion of the first conductive layer, the impurity concentration is reduced from the end portion to the inner side of the taper portion of the first conductive layer. Further, the impurity element is added to the high concentration impurity regions 118 to 121 to form the high concentration impurity regions 130 to 133. Note that the second doping process corresponds to the second doping process described in Embodiment Mode 1 (FIG. 2C).

By performing the second doping process, impurity regions (LDD regions) 134a to 137a which do not overlap with the first conductive layers 138 to 142 are formed. Note that, impurity regions (GOLD regions) 134b to 137b remain overlapped with the first conductive layers 138 to 142.

Figure 12B:
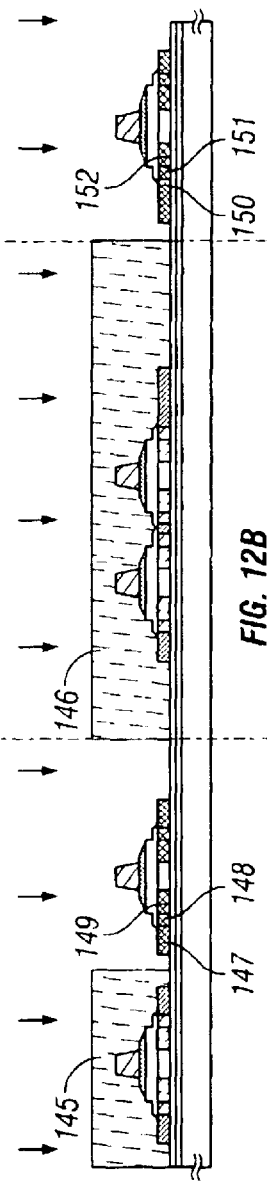

Next, after removing the mask consisting of resist, new masks 145 and 146 consisting of resist are formed to perform the third doping process. With the third doping process, impurity regions 147 to 152, with an impurity element which imparts a conductivity type (p-type) opposite to the single conductivity type (n-type) added into the semiconductor layer which is to be the active layer of the p-channel TFT, are formed (FIG. 12B). The first conductive layers 139 and 142 are used as masks to the impurity element, and impurity regions are formed in a self aligning manner by adding an impurity element which imparts a p-type. In this embodiment, the impurity regions 147 to 152 are formed by an ion doping method using diborane ($B_2H_6$). Note that, when performing the third doping process, the semiconductor layer forming the n-channel TFT is covered by the masks 145 and 146 consisting of resist. In the first doping process and the second doping process, phosphorus is added to the impurity regions 147 to 152 at different concentrations. In any of the regions, doping is performed such that the concentration of the impurity element imparting the p-type is $2\times10^{20}$ to $2\times10^{21}$ atoms/cm$^3$. Thus, there is no problem for the regions to function as a source region or a drain region of a p-channel TFT. In this embodiment, by the third etching process, a portion of a semiconductor layer to be an active layer of a p-channel TFT is exposed, and therefore, there is an advantage that an impurity element (boron) is easily added.

A desired impurity region is formed in each semiconductor layer in the above processes.

Subsequently, the masks 145 and 146 consisting of resist are removed, and a first interlayer insulating film (a) 153*a* is formed. This first interlayer insulating film (a) 153*a* is formed of an insulating film containing silicon by plasma CVD or sputtering into a thickness of 50 to 100 nm. In this embodiment, a silicon oxynitride film with a film thickness of 50 nm is formed by plasma CVD. Of course, the first interlayer insulating film (a) 153*a* is not particularly limited to the silicon oxynitride film, and other insulating film containing silicon may be formed into a single layer or a lamination structure.

Figure 12C:
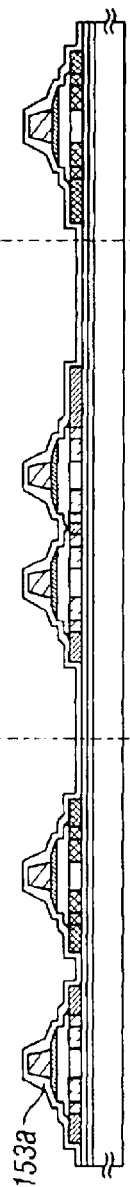

Then, a process of activating the impurity elements added into the respective semiconductor layers is carried out (FIG. 12C). This activation process is carried out by thermal annealing using a furnace annealing oven. The thermal annealing may be performed in a nitrogen atmosphere having an oxygen concentration of 1 ppm or less, preferably 0.1 ppm or less and at 400 to 700° C., typically 500 to 550° C. In this embodiment, a heat treatment at 550° C. for 4 hours is carried out. Note that, in addition to the thermal annealing method, a laser annealing method, or a rapid thermal annealing method (RTA method) can be applied thereto.

Note that, in this embodiment, at the same time as the above activation process, nickel used as the catalyst for crystallization is gettered to the impurity regions (130, 132, 147, 150) containing phosphorus at high concentration. As a result, nickel concentration of the semiconductor layer that mainly becomes a channel forming region is lowered. The TFT having the channel forming region thus formed is decreased in off current value, and has high electric field mobility because of the good crystallinity, thereby attaining satisfactory characteristics.

Further, an activation process may be performed before forming the first interlayer insulating film. However, in the case where a wiring material is weak to heat, it is preferable that the activation process is performed after an interlayer insulating film (an insulating film containing silicon as its main ingredient, for example, a silicon oxynitride film) is formed to protect the wiring or the like as in this embodiment.

Besides, in the case of using a laser annealing method as the activation process, laser light emitted from an excimer laser, a YAG laser or the like may be irradiated.

Subsequently, a first interlayer insulating film (b) 153*b* is formed. The first interlayer insulating film (b) 153*b* is formed of an insulating film containing silicon by plasma CVD or sputtering into a thickness of 50 to 200 nm. In this embodiment, a silicon nitride film with a film thickness of 100 nm is formed by plasma CVD. Of course, the first interlayer insulating film (b) 153*b* is not particularly limited to the silicon nitride film, and other insulating film containing silicon may be formed into a single layer or a lamination structure.

Figure 12D:
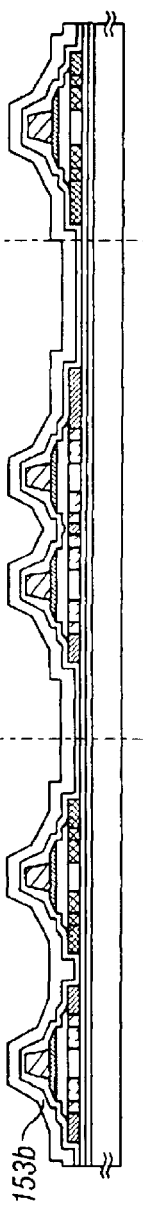

Next, heat treatment at 300 to 550° C. for 1 to 12 hours is performed in an inert atmosphere to perform a step of hydrogenating the semiconductor layers. It is preferable that hydrogenation is performed at a temperature lower than the temperature of heat treatment in the activation process (400 to 500° C.) (FIG. 12D). In this embodiment, the heat treatment is performed at 410° C. for 1 hour in a nitrogen atmosphere. This step is a step of terminating dangling bonds in the semiconductor layer by hydrogen contained in the interlayer insulating film. As another means for hydrogenation, hydrogenation by a heat treatment performed at 300 to 550° C. for 1 to 12 hours in an atmosphere containing hydrogen of 3 to 100% or plasma hydrogenation (using hydrogen excited by plasma) may be carried out.

Further, after removing the masks 145 and 146 consisting of resist, heat activation (typically in a nitrogen atmosphere at 500 to 550° C.) is performed, a first interlayer insulating film formed of an insulating film containing silicon (typically a silicon nitride film with a thickness of 100 to 200 nm) is formed, and thereafter hydrogenation may be performed (in a nitrogen atmosphere at 300 to 500° C.).

Next, a second interlayer insulating film 154 made of an organic insulating material is formed on the first interlayer insulating film (b) 153*b*. In this embodiment, an acrylic resin film having a film thickness of 1.6 μm is formed.

Next, a transparent conductive film is formed with a thickness of 80 to 120 nm on the second interlayer insulating film 154, and patterned to form a pixel electrode 162. As the transparent conductive film, an indium oxide-zinc oxide alloy ($In_2O_3$—ZnO) and a zinc oxide (ZnO) are suitable materials, and further zinc oxide added with gallium (Ga) (ZnO:Ga) may be suitably used to increase the transmittance or conductivity of visible light.

Note that, an example of using a transparent conductive film as a pixel electrode is shown here. However, if a pixel electrode is formed using a conductive material with reflectivity, a reflection type display device may be manufactured.

Then, patterning is performed for forming contact holes reaching the respective impurity regions 130, 132, 147, and 150.

Then, in a driver circuit 205, electrodes 155 to 161 electrically connected to the impurity region 130 or the impurity region 147, respectively, are formed. Note that, these electrodes are formed by patterning a lamination film of a Ti film with a film thickness of 50 nm and an alloy film (alloy film of Al and Ti) with a film thickness of 500 nm.

Figure 13:
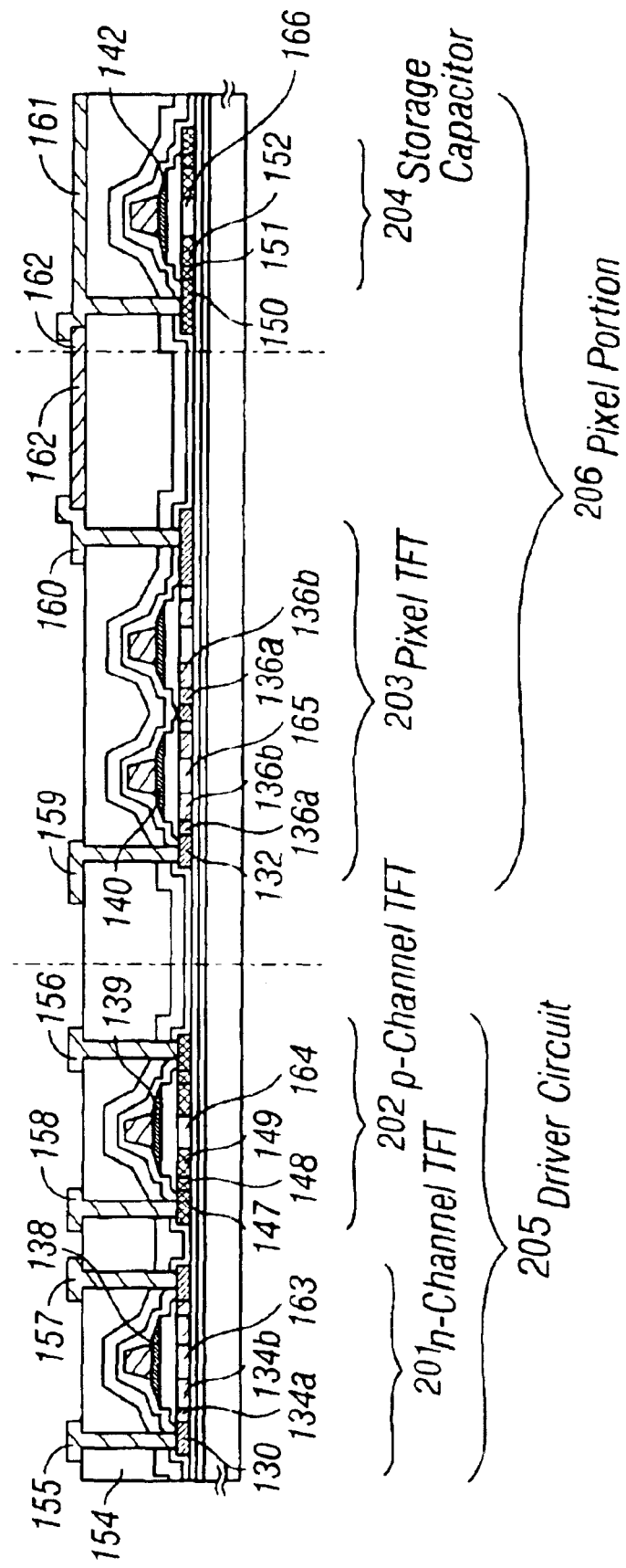
FIG. 13 shows the manufacturing process of an AM-LCD (Embodiment 1)

In a pixel portion 206, a connection electrode 160 or a source electrode 159 contacting the impurity region 132 is formed, and a connection electrode 161 contacting the impurity region 150 is formed. Note that, by forming the connection electrode 160 to overlap and contact the pixel electrode 162, the connection electrode 160 is electrically connected to a drain region of a pixel TFT. Also, the connection electrode 160 is electrically connected to the semiconductor layer (impurity region 150) which functions as one of the electrodes forming the storage capacitor (FIG. 13).

As described above, the driver circuit 205 including an n-channel TFT 201 and a p-channel TFT 202, and the pixel portion 206 including a pixel TFT 203 and a storage capacitor 204 can be formed on the same substrate. In this specification, such a substrate is called an active matrix substrate for convenience.

The n-channel TFT 201 of the driver circuit 205 includes a channel forming region 163, the low concentration impurity region 134b (GOLD region) overlapping with the first conductive layer 138 forming a part of the gate electrode, the low concentration impurity region 134a (LDD region) formed outside the gate electrode. and the high concentration impurity region 130 functioning as a source region or a drain region. The p-channel TFT 202 includes a channel forming region 164, an impurity region 149 overlapping with the first conductive layer 139 forming a part of the gate electrode, an impurity region 148 formed outside the gate electrode, and the impurity region 147 functioning as a source region or a drain region.

The pixel TFT 203 of the pixel portion 206 includes a channel forming region 165, the low concentration impurity region 135b (GOLD region) overlapping with the first conductive layer 140 forming the gate electrode, the low concentration impurity region 136a (LDD region) formed outside the gate electrode, and the high concentration impurity region 132 functioning as a source region or a drain region. Further, impurity elements imparting p-type are added to the respective semiconductor layers 150 to 152 functioning as one of the electrodes of the storage capacitor 204. The storage capacitor 204 is formed by the electrodes 125 and 142 and the semiconductor layers 150 to 152 and 166, using the insulating film 144 as a dielectric.

By following the steps shown in this embodiment, the number of photo masks required for manufacturing the active matrix substrate may be set to six. As a result, this can contribute to shortening the manufacturing steps, reduction of the manufacturing cost, and improvement of the yield.

[Embodiment 2]

Figure 14:
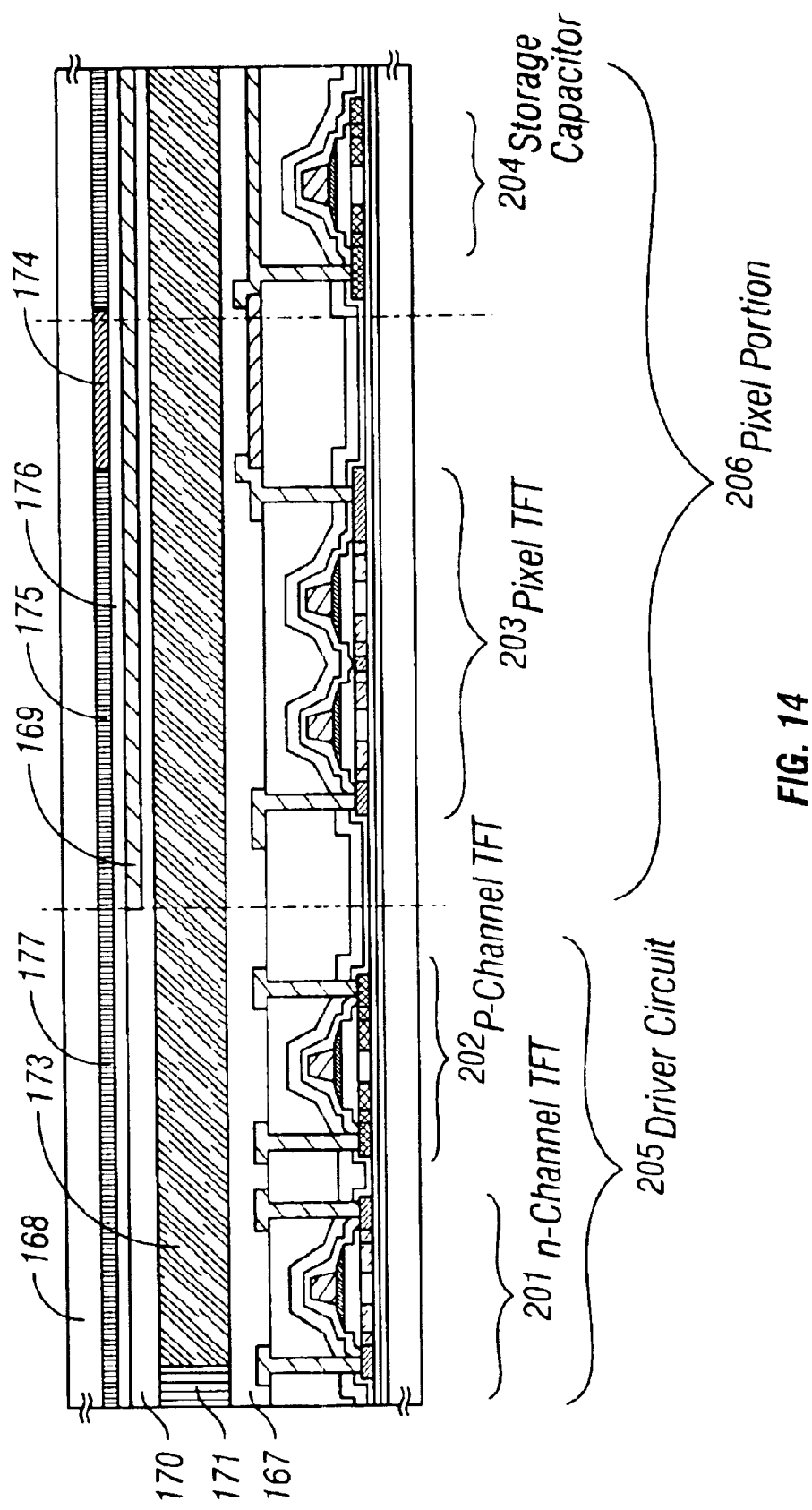
FIG. 14 is a cross-sectional structural view of a transmission type liquid crystal display device (Embodiment 1)

In this embodiment, the manufacturing process of an active matrix liquid crystal display device from the active matrix substrate 100 manufactured in Embodiment 1 is described below. FIG. 14 is used for explanation.

First, in accordance with Embodiment 1, the active matrix substrate 100 in a state shown in FIG. 13 is obtained, and thereafter, an alignment film 167 is formed on the active matrix substrate 100 of FIG. 13, and is subjected to a rubbing process. Note that, in this embodiment, before the formation of the alignment film 167, a columnar spacer for maintaining a gap between the substrates is formed at a desired position by patterning an organic resin film such as an acrylic resin film. Further, spherical spacers may be scattered on the entire surface of the substrate in place of the columnar spacer.

Next, an opposing substrate 168 is prepared. On the opposing substrate 168, there are formed a colored layers 174, a light shielding layer 175 and color filters arranged to correspond to the respective pixels. Further, the driver circuit portion is also provided with a light shielding layer 177. A leveling film 176 is provided to cover the color filters and the light shielding layer 177. Next, in the pixel portion an opposing electrode 169 is formed from a transparent conductive film on the leveling film 176, an alignment film 170 is formed on the entire surface of the opposing substrate 168, and a rubbing process is conducted thereon.

Then, the active matrix substrate 100 on which a pixel portion and a driver circuit are formed is stuck with the opposing substrate 168 by a sealing agent 171. A filler is mixed in the sealing agent 171, and the two substrates are stuck with each other while keeping a uniform gap by this filler and the columnar spacer. Thereafter, a liquid crystal material 173 is injected between both the substrates to encapsulate the substrates completely by an encapsulant (not shown). A known liquid crystal material may be used as the liquid crystal material 173. Thus, the active matrix liquid crystal display device shown in FIG. 14 is completed. Then, if necessary, the active matrix substrate 100 and the opposing substrate 168 are parted into desired shapes. In addition, by using a known technique, a phase difference plate, a polarizing plate or the like may be suitably provided. Then, an FPC is stuck with the substrate using a known technique.

Figure 15A:
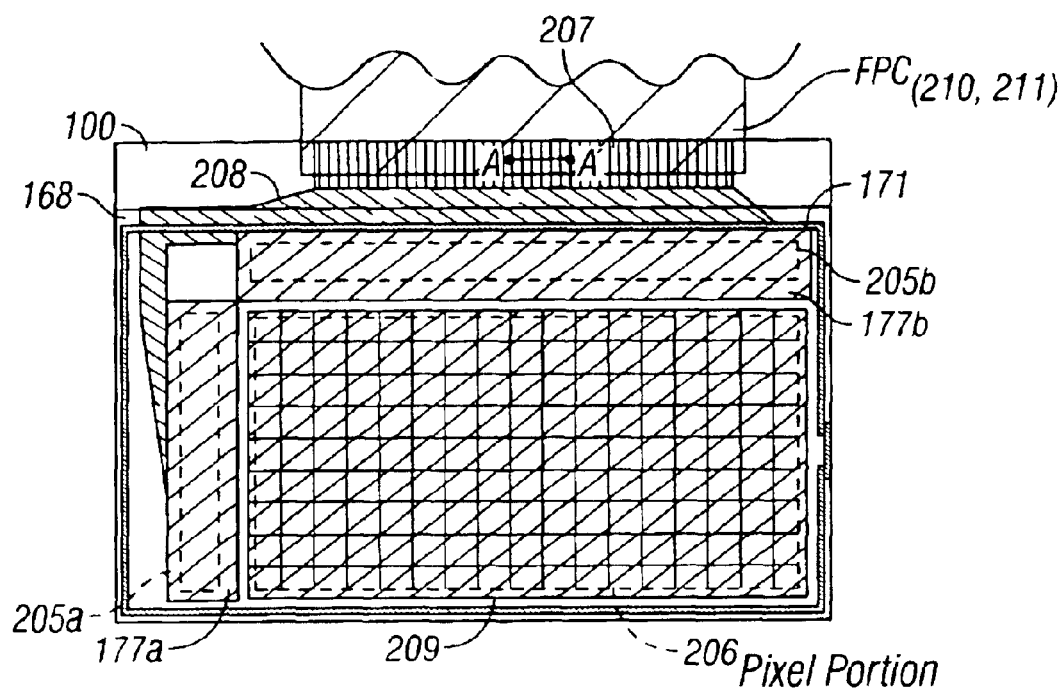
FIGS. 15A and 15B are outward appearance views of a liquid crystal display panel (Embodiment 2)

The structure of the liquid crystal display panel obtained in this way is described using the top view of FIG. 15A. In FIG. 15A, the same symbols are used for the parts corresponding to those in FIG. 14.

In the top view shown in FIG. 15A, the active matrix substrate 100 provided with an external input terminal 207 for adhering the pixel portion, the driver circuit and the FPC (flexible printed circuit), a wiring 208 connecting the external input terminal to the input portion of each circuit, and the like, and the opposing substrate 168 provided with color filters and the like are adhered by the sealing agent 171.

A light shielding layer 177a is provided on the opposing substrate 168 side overlapping with a gate wiring side driver circuit 205a, and a light shielding layer 177b is provided on the opposing substrate 168 side overlapping with a source wiring side driver circuit 205b. Further, a color filter 209 provided on the opposing substrate 168 side on the pixel portion 206 is provided with the light shielding layer and the respective colored layers of each color of red (R), green (G), and blue (B) corresponding to each pixel. When display is actually performed, color display is performed with the three colors of the red-colored (R) layer, the green-colored (G) layer, and the blue-colored (B) layer. The arrangement of the colored layers of respective colors may be arbitrary.

The color filter 209 is provided on the opposing substrate 168 for color, but it is not particularly limited thereto, and when manufacturing the active matrix substrate 100, a color filter may be formed on the active matrix substrate 100.

Further, a light shielding layer is provided between the adjacent pixels in the color filter, and portions other than the display region is shielded from light. Further, light shielding layers 177a and 177b are provided in regions covering the driver circuit, but the regions covering the driver circuit are covered when the liquid crystal display device is later incorporated as a display portion of electric equipment, so that the structure may be such that a light shielding layer is not particularly provided. Further, when manufacturing the active matrix substrate 100, a light shielding layer may be formed on the active matrix substrate 100.

Further, the portions other than the display region (gaps between pixel electrodes) and the driver circuit may be shielded from light without providing the light shielding layers 177a and 177b and with suitably arranging a lamination of a plurality of colored layers, constituting the color filter, between the opposing substrate 168 and the opposing electrode 169.

Further, in the external input terminal, FPCs 210 and 211 formed by a base film 210 and a wiring 211 are adhered through an anisotropic conductive resin 212. Further the mechanical strength is increased by a reinforcing plate.

Figure 15B:
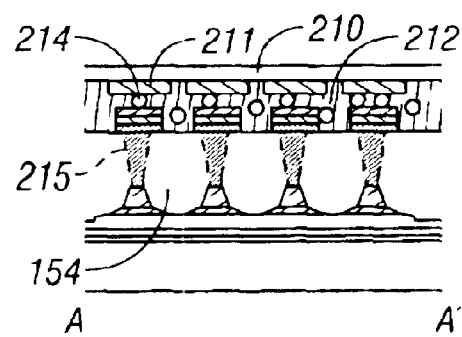

FIG. 15B is a cross sectional view of the external input terminal 207 along the line E–E'. Since the outer diameter of the conductive particle 214 is smaller than the pitch of a wiring 215, if an appropriate amount of conductive grains 214 are dispersed in the adhesive agent 212, short circuit does not occur with the adjacent wirings, and an electrical connection with a corresponding wiring on the FPCs 210 and 211 side may be formed.

The liquid crystal display panel formed as described above may be used as a display portion of various electric equipment.

[Embodiment 3]

In this embodiment, a method of manufacturing an active matrix substrate different from that in Embodiment 1 is described with reference to FIG. 16. In Embodiment 1, a transmission type display device is formed, but in this embodiment it is featured that a reflection type display device is formed to reduce the number of masks compared to Embodiment 1.

Note that, the steps through the formation of the second interlayer insulating film 154 is the same as Embodiment 1, and therefore they are omitted here.

According to Embodiment 1, after forming the second interlayer insulating film, patterning is performed to form contact holes reaching the respective impurity regions.

Next, similarly as in Embodiment 1, electrodes electrically connecting to portions of the semiconductor layer (high concentration impurity region) are formed. Note that, these electrodes are formed by patterning a lamination film of a Ti film with a thickness of 50 nm and an alloy film (an alloy film of Al and Ti) with a thickness of 500 nm.

Further, in the pixel portion, a pixel electrode 1202 contacting a high concentration impurity region 1200, and a source electrode 1203 contacting a high concentration impurity region 1201 are formed. Further, the pixel electrode 1202 is electrically connected with the high concentration impurity region 1200 of the pixel TFT, and further is electrically connected to a semiconductor layer (high concentration impurity region 1204) which functions as one of the electrodes forming a storage capacitor (FIG. 16).

Note that, for the pixel electrode 1202, a film containing Al or Ag as the main component, or a lamination film thereof which has excellent reflection property is preferably used.

In accordance with the steps shown in this embodiment, the number of photo masks necessary for manufacturing the active matrix substrate may be set to five. As a result, this can contribute to shortening the manufacturing steps, reduction of the manufacturing cost, and improvement of the yield.

Further, after the formation of the pixel electrode, the surface of the pixel electrode is made uneven by means of a known method such as a sandblasting method or an etching method, and it is preferred that a whitening degree is increased by scattering the reflection light, while preventing mirror-reflection. Further, the insulating film may be made uneven before forming the pixel electrode and the pixel electrode may be formed thereon.

[Embodiment 4]

Figure 17:
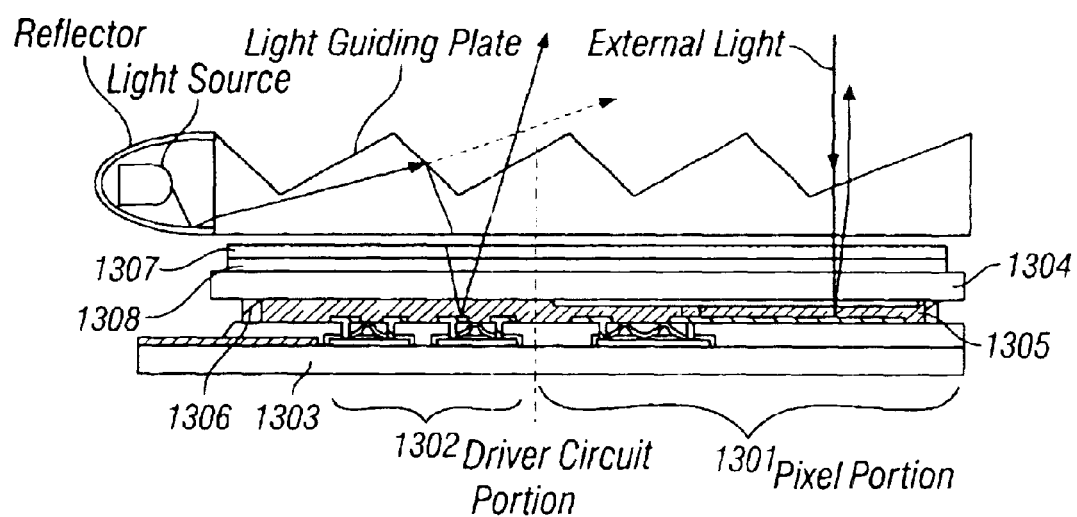
FIG. 17 is a cross-sectional structural view of a reflection type liquid crystal display panel provided with a light source (Embodiment 4)

In this embodiment, a manufacturing process of a reflection type liquid crystal display device from the active matrix substrate manufactured in accordance with Embodiment 3 will be described hereinbelow. FIG. 17 is used for an explanation thereof.

Figure 16:
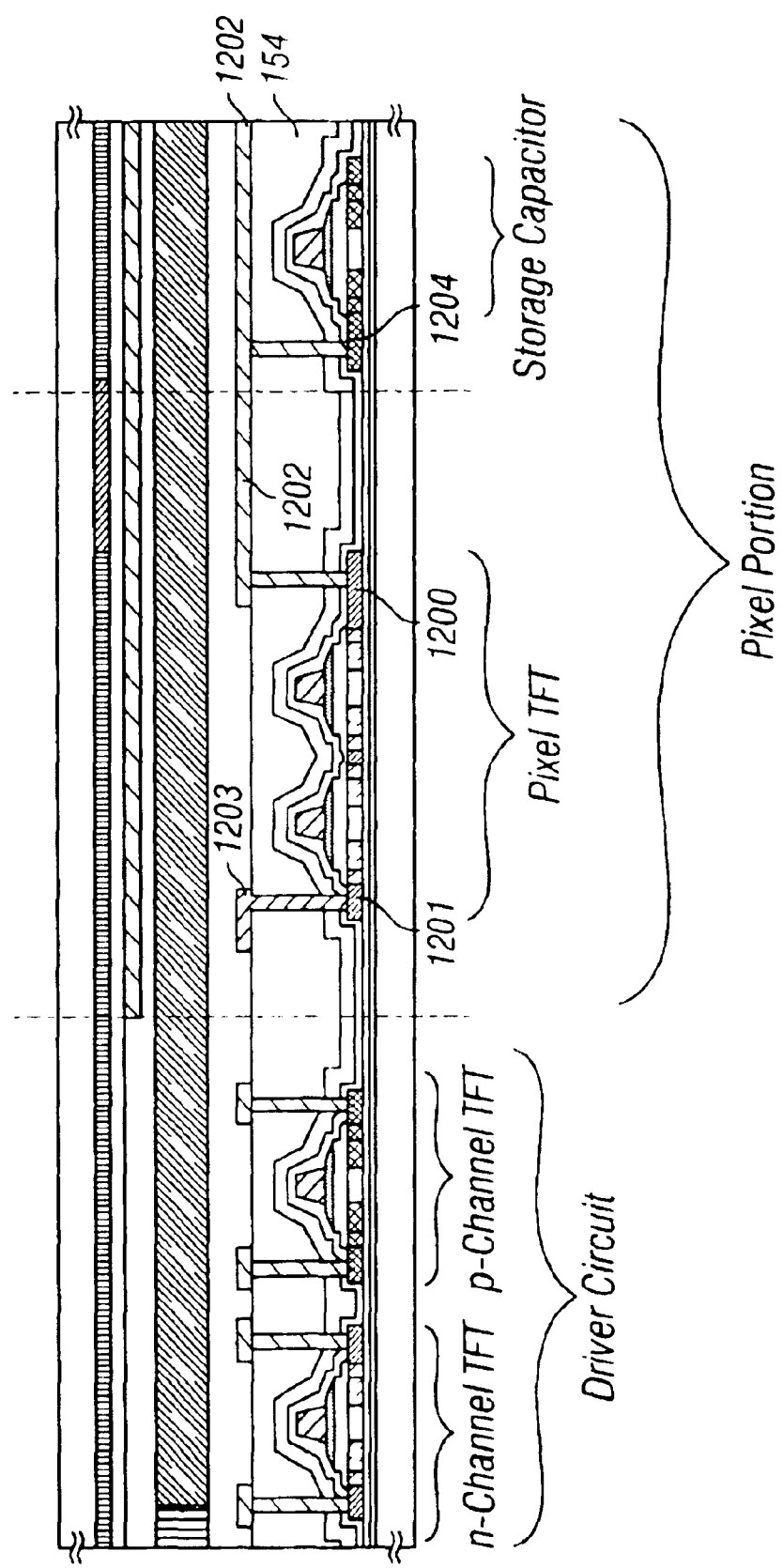
FIG. 16 is a cross-sectional structural view of a reflection type liquid crystal display device (Embodiment 3)

First, in accordance with Embodiment 3, the active matrix substrate in a state shown in FIG. 16 is obtained, and thereafter an alignment film is formed on at least the pixel electrode, on the active matrix substrate of FIG. 16, and is subjected to a rubbing process. Note that, in this embodiment, before the formation of the alignment film, a columnar spacer (not shown) for maintaining a gap between the substrates is formed at a desired position by patterning an organic resin film such as an acrylic resin film. Further, spherical spacers may be scattered on the entire surface of the substrate in place of the columnar spacer.

Next, an opposing substrate 1304 is prepared. Color filters with a colored layer and a light shielding layer arranged corresponding to each pixel are provided. Next, a leveling film is formed to cover the color filters.

Subsequently, an opposing electrode made of a transparent conductive film is formed in at least the pixel portion on the leveling film, and an alignment film is formed on the entire surface of the opposing substrate. Then, the rubbing process is performed thereon.

Then, an active matrix substrate 1303 on which a pixel portion 1301 and a driver circuit 1302 are formed is stuck with the opposing substrate 1304 by a sealing agent 1306. In the sealing agent 1306, a filler is mixed, and the two substrates are stuck with each other while keeping a uniform gap by the effect of this filler and the columnar spacer. Thereafter, a liquid crystal material 1305 is injected between both the substrates to encapsulate the substrates completely by an encapsulant. A known liquid crystal material may be used as the liquid crystal material 1305. Note that, the gap between the substrates is about half that compared to Embodiment 2 since this embodiment relates to a reflection type display device. Thus, the reflection type liquid crystal display device is completed. Then, if necessary the active matrix substrate or the opposing substrate may be parted into desired shapes. Further, a polarizing plate 1307 and a phase difference plate 1308 are adhered to only the opposing substrate. Then, an FPC is adhered using a known technique.

The reflection type liquid crystal display panel manufactured as described above may be used as a display portion of various electric equipments.

Further, with only the above liquid crystal display panel, in the case of use in a dark place, a problem of visibility occurs. Accordingly, it is preferable to use a structure with a light source, a reflector and a light guiding plate as shown in FIG. 17.

As the light source, one or a plurality of LEDs or cold-cathode tubes may be used. The light source shown in FIG. 17 is arranged along the side surface of the light conductive plate, and a reflector is provided behind the light source.

When the light irradiated from the light source enters efficiently inside from the side surface of the light conductive plate by the reflector, the light is reflected by a special prism processed surface provided on the surface, to enter into the liquid crystal display panel.

In this way by combining the liquid crystal display panel, the light source and the light conductive plate, the utilization efficiency of light may be improved.

[Embodiment 5]

This embodiment shows all example of a manufacturing method different from Embodiment 1. Note that, this embodiment differs from Embodiment 1 only in the steps through the formation of the semiconductor layers 102 to 105 and the steps thereafter are the same as that of Embodiment 1, thus the description thereof is omitted.

First, as in Embodiment 1 a substrate is prepared. In a case that a transmission type display device is manufactured, the substrate may be a glass substrate, a quartz substrate or the like. In addition, a plastic substrate which is heat resistant against the process temperature of this embodiment may be used. Further, in a case that a reflection type display device is manufactured, a ceramic substrate, a silicon substrate, a metal substrate or a stainless substrate with an insulating film formed on the surface thereof may also be used.

Subsequently, an insulating film such as a silicon oxide film, a silicon nitride film, or a silicon oxynitride film as a base film is formed on the substrate. In this embodiment, a two layer structure may be used as the base film, but a single layer film or a structure with two or more layers of the above insulating film may be used. In this embodiment, the first layer and the second layer of the base film are sequentially formed in the first film forming chamber, by a plasma CVD method. As the first layer of the base film, a silicon oxynitride film is formed with $SiH_4$, $NH_3$ and $N_2O$ as reaction gases with a thickness of 100 to 200 nm (preferably 50 to 100 nm), by the plasma CVD method. In this embodiment, a silicon oxynitride film is formed with a thickness of 50 nm (composition ratio Si=32%, O=27%, N=24%, H=17%). Subsequently, as the second layer of the base film, a silicon oxynitride film is formed in lamination with $SiH_4$ and $N_2O$ as reaction gases with a thickness of 50 to 200 nm (preferably 100 to 150 nm), by the plasma CVD method. In this embodiment, a silicon oxynitride film with a thickness of 100 nm (composition ratio Si=32%, O=59%, N=7%, H=2%) is formed.

Subsequently an amorphous semiconductor film is formed on the base film in the second film forming chamber. The amorphous semiconductor film is formed to a thickness of 30 to 60 nm. There is no limit on the material of the amorphous semiconductor film, but silicon or silicon germanium alloy is preferably used. In this embodiment, an amorphous silicon film is formed using $SiH_4$ gas by a plasma CVD method.

Further, since both the base film and the amorphous semiconductor film may be formed by the same film formation method, the base film and the amorphous semiconductor film may be formed sequentially.

Subsequently, Ni is added to the amorphous silicon film in the third film forming chamber. By the plasma CVD method, an electrode with Ni as a material is attached, and plasma is excited by injecting argon gas or the like, to thereby add Ni. Of course, an ultra-thin Ni film may be formed by an evaporation method or a sputtering method.

Subsequently, a protective film is formed in the fourth film forming chamber. Other films such as silicon oxide film and a silicon oxynitride film may be used for the protective film. A compact film such as a silicon nitride film should not be used, since hydrogen will be hard to be removed when performing dehydrogenation in the later step. In this embodiment, TEOS (tetraethyl orthosilicate) and $O_2$ are mixed, to form a silicon oxide film with a thickness of 100 to 150 nm by a plasma CVD method. In this embodiment, it is a feature that the steps through the formation of a silicon oxide film as the protective film are sequentially performed without exposure to a clean room atmosphere.

Further, the film formed in the respective film forming chambers, may be formed by any known forming method such as a plasma CVD method, a thermal CVD method, a low pressure CVD method, an evaporation method, or a sputtering method.

Next, the dehydrogenation of the amorphous silicon film is performed (500° C. for 1 hour) and then a thermal crystallization is performed (550° C. for 4 hours) on the amorphous silicon film. Note that, the present invention is not limited to a method of adding a catalyst element such as Ni to the amorphous silicon film as shown in this embodiment, and thermal crystallization may be conducted by a known method.

Then, an impurity element imparting a p-type is added to control the threshold (Vth) of the n-channel TFT. As an impurity element that imparts a p-type to the semiconductor, boron (B), aluminum (Al), gallium (Ga) and the like of group 13 of the periodic table are known. In this embodiment, boron (B) is added.

After boron is added, the silicon oxide film as a protective film is removed by an etchant such as a hydrofluoric acid. Next, washing and laser annealing are continuously performed. By performing laser annealing after adding boron (B), which is an impurity element imparting p-type, to the amorphous semiconductor film, crystallization occurs with boron as a part of a crystal structure of a crystalline semiconductor film. Thus, it is possible to prevent the destruction of the crystal structure that occurs in the conventional technique.

Using the acid solution containing pure water with ozone and fluorine, it is possible to remove the contaminated impurities attached to the surface of the film, as well as the ultra-thin oxide film formed when washing with pure water with ozone. As a method of manufacturing pure water with ozone, there is a method of electrolysis of pure water, a method of directly injecting ozone gas into pure water, or the like. Further, the concentration of ozone is preferably 6 mg/L or higher. Note that, conditions of the rotation number and time condition of the spin device may suitably be set by the substrate area, the film material and the like.

For laser annealing, a method where laser light radiated from a laser oscillator is converged into a linear shape by an optical system to be irradiated onto the semiconductor film may be used. The condition of crystallization by laser annealing may be suitably selected by the operator.

The crystalline semiconductor film obtained in this way may be patterned to a desired shape, and island like semiconductor layers 102 to 105 are formed.

In the steps hereafter, a liquid crystal display panel shown in FIGS. 12A to 12D may be formed.

Note that, this embodiment may be freely combined with any of Embodiments 1 to 4.

[Embodiment 6]

In this embodiment an example of manufacturing an EL (electro luminescence) display device is described in accordance with this invention. Note that, FIG. 18 is a cross sectional view of an EL display device applied with this invention.

The EL (electro-luminescence) devices referred to in this specification include triplet-based light emission devices and/or singlet-based light emission devices, for example.

Figure 18:
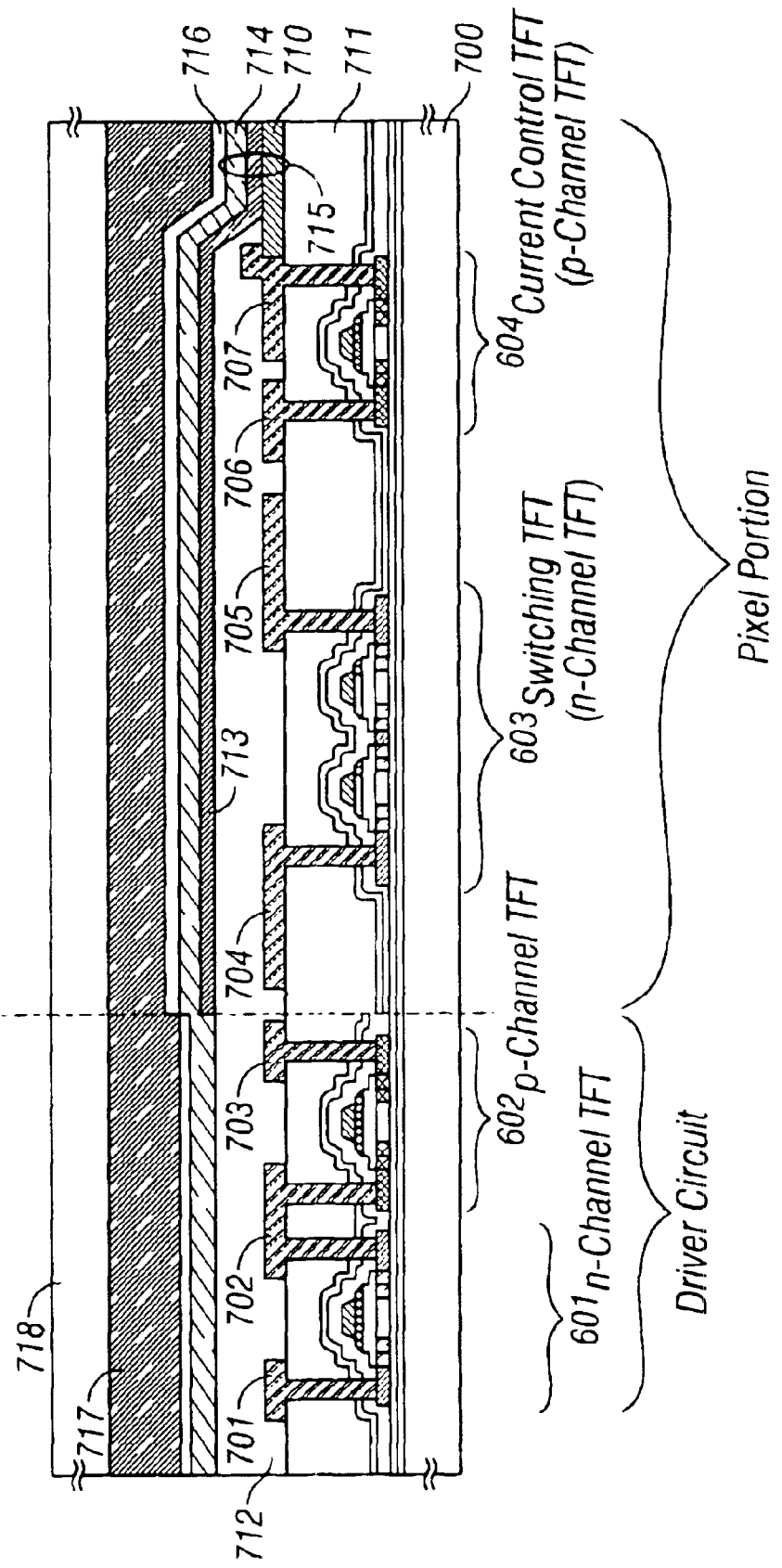
FIG. 18 shows the structure of an active matrix EL display device.

As shown in FIG. 18, the switching TFT 603 provided on the substrate 700 is formed using the n-channel TFT 203 in FIG. 13B. Therefore, the explanation of the n-channel TFT 203 may be referenced for the explanation of the structure.

Note that, this embodiment adopts a double gate structure formed with two channel forming regions, but a single gate structure formed with one channel forming region or a triple gate structure formed with three channel forming regions may be adopted.

The driver circuit formed on the substrate 700 is formed with the CMOS circuit. Therefore, the explanation of the n-channel TFT 201 and the p-channel TFT 202 may be referenced for the explanation of the structure. Note that, a single gate structure is used in this embodiment, but a double gate structure or a triple gate structure may also be used.

Further, wirings 701 and 703 function as source wirings of a CMOS circuit, reference numeral 702 functions as a drain wiring, 704 functions as a source wiring electrically connected to a source region of a switching TFT, and 705 functions as a drain wiring electrically connected to a drain region of a switching TFT.

The current control TFT 604 can be formed of the p-channel TFT 202 in FIG. 13. Therefore, the explanation of the p-channel TFT 202 may be referenced for the explanation of the structure. Note that, a single gate structure is used in this embodiment, but a double gate structure or a triple gate structure may also be used.

Further, a wiring 706 is a source wiring (corresponding to a current supply line) of a current controlling TFT, and reference numeral 707 indicates an electrode which electrically connects with a pixel electrode 710 by overlapping with the pixel electrode 710 of the current controlling TFT.

Note that, reference numeral 710 is the pixel electrode (an anode of an EL element) formed of a transparent conductive film. As the transparent conductive film, a conductive film made from a compound composed of indium oxide and tin oxide, a compound composed of indium oxide and zinc oxide, zinc oxide, tin oxide, or indium oxide can be used. In addition, a film in which gallium is added into the transparent conductive film may be used. The pixel electrode 710 is formed on a level interlayer insulating film 711 before forming the wirings. In this embodiment, it is very important to level the steps made by TFTs by the level interlayer insulating film 711 made of resin. The EL layer to be formed later is extremely thin so that a defect in light emission may occur due to the presence of the steps. Therefore, in order to form the EL layer on as level a surface as possible, it is preferable to perform leveling before the pixel electrode is formed.

After forming the wirings 701 to 707, as shown in FIG. 18, a bank 712 is formed. The bank 712 may be formed by patterning an insulating film containing silicon or an organic resin film with a thickness of 100 to 400 nm.

Note that, since the bank 712 is an insulating film, attention should be paid on electrostatic breakdown in elements at film formation. In this embodiment, carbon particles or metal particles are added to the insulating film which is a material of the bank 712 to lower the resistivity, and to suppress the occurrence of static electricity. At this time, the amount of carbon particles or metal particles to be added may be adjusted so that resistivity becomes $1 \times 10^6$ to $1 \times 10^{12}$ Ωm (preferably $1 \times 10^8$ to $1 \times 10^{10}$ Ωm).

An EL layer 713 is formed on the pixel electrode 710. Note that, in FIG. 18 only one pixel is shown, but in this embodiment, an EL layer corresponding to each of the colors of red (R), green (G) and blue (B) is formed. Further, in this embodiment, a low molecular weight type organic EL material is formed by an evaporation method. Specifically, a lamination structure provided with a copper phthalocyanine (CuPc) film with a thickness of 20 nm as a hole injecting layer, and a tris-8-aluminum quinolinolate complex (Alq$_3$) film with a thickness of 70 nm as a light emitting layer is used. Furthermore, a fluorescent pigment such as quinacridon, perylene or DCM1 may be added into Alq$_3$ to control the color of light emission.

However, the above example is one example of an organic EL material that may be used as the EL layer 713, and the present invention is not limited thereto. The EL layer 713 (a layer for performing light emission and the movement of the carrier for the light emission) may be formed by freely combining a light emitting layer, a charge transporting layer and a charge injecting layer. For example, in this embodiment, an example of using a low molecular weight type organic EL material as an EL layer is shown, but a polymer organic EL material may also be used. Further, it is possible to use an inorganic material such as silicon carbide as a charge transportation layer or a charge injection layer. As these organic EL material and inorganic material, known materials may be used.

Next, a cathode 714 made of a conductive film is formed on the EL layer 713. In the case of this embodiment, an alloy film of aluminum and lithium is used as the conductive film. Of course, a known MgAg film (an alloy film of magnesium and silver) may be used. As a cathode material, a conductive film made of an element of group 1 or 2 of the periodic table or a conductive film added with those elements may be used.

At the point of time when the cathode 714 is formed, an EL element 715 is completed. Note that, the EL element 715 here indicates a capacitor formed of the pixel electrode (anode) 710, the EL layer 713 and the cathode 714.

It is effective to provide a passivation film 716 to completely cover the EL element 715. The passivation film 716 may be formed of an insulating film containing a carbon film, a silicon nitride film or a silicon oxynitride film, and is used as a single layer of the insulating film or a lamination layer of a combination thereof.

At this time, it is preferable to use a film with good coverage as the passivation film, and it is particularly effective to use a DLC (diamond like carbon) film. Since the DLC film may be formed in a temperature range of room temperature to 100° C., it may be formed easily above the EL layer 713 which has low heat resistance. Further, the DLC film has a high blocking effect against oxygen, and may suppress oxidation of the EL layer 713. Therefore, a problem in that oxidation of the EL layer 713 occurs before the subsequent sealing step may be prevented.

Further, in this embodiment, a sealing agent 717 is provided on the passivation film 716 and a cover member 718 is adhered. As the sealing agent 717 an ultraviolet curing resin may be used, and it is effective to provide a substance having a hygroscopic effect or a substance having a oxidation prevention effect. Further, in this embodiment, as the cover member 718, a glass substrate, a quartz substrate or a plastic substrate (including plastic film) formed with carbon films on both surfaces (preferably a diamond like carbon film) may be used.

An EL display device with the structure as shown in FIG. 18 is thus completed. Note that, after the bank 712 is formed, it is effective to sequentially perform the processes until the formation of the passivation film 716 using a film forming device of a multi chamber method (or an inline method) without exposure to the atmosphere. Further, the process until the cover member 718 is adhered may be sequentially performed without exposure to the atmosphere.

In this way, n-channel TFTs 601 and 602, a switching TFT (n-channel TFT) 603 and a current control TFT (n-channel TFT) 604 are formed on the insulator 501 of a plastic substrate as a base. The number of masks necessary until the manufacturing steps here, is less than that for a generally used active matrix EL display device.

Namely, the manufacturing steps of a TFT is largely simplified, and reduction of the manufacturing cost and improvement in the yield may be realized.

Further, as explained with reference to FIG. 13, by providing an impurity region overlapping the gate electrode through the insulating film, an n-channel TFT strong against deterioration due to the hot carrier effect may be formed. Therefore, an EL display device with high reliability may be realized.

Further, in this embodiment, although only the structure of the pixel portion and the driver circuit is shown, it is possible to form a logical circuit other than the driver circuit, such as a signal dividing circuit, a D/A converter circuit, an operational amplifier circuit, or a -correction circuit, on the same insulator in accordance with the manufacturing steps of the circuits of this embodiment. In addition, a memory portion, a microprocessor, or the like can be formed on the same insulator.

Further, the EL light emitting device of this embodiment performed up through the sealing (or filling) step to protect the EL element is explained with reference to FIGS. 19A and 19B. Note that, if necessary, the reference numerals used in FIG. 18 may be used.

Figure 19A:
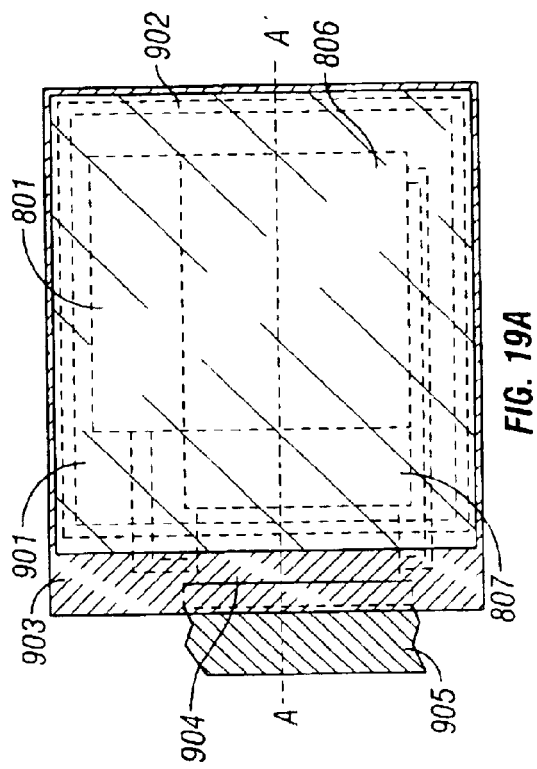
FIGS. 19A and 19B show the structure of the active matrix EL display device.
Figure 19B:
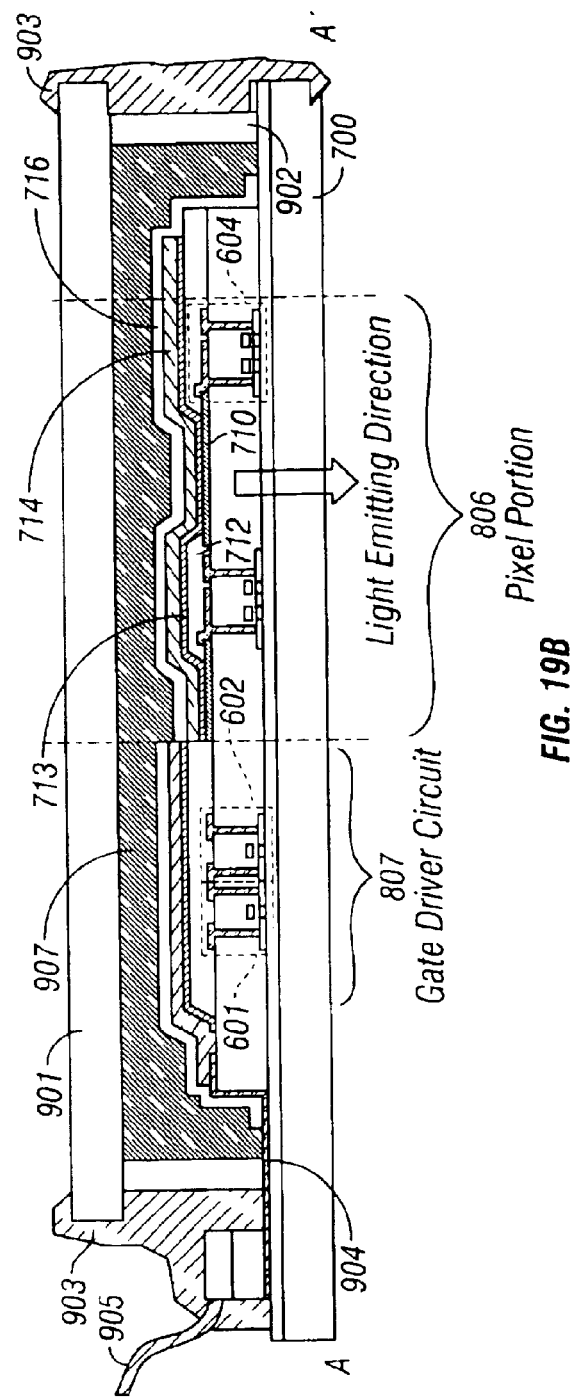

FIG. 19A is a top view showing the state that the steps through sealing of the EL element are performed, and FIG. 19B is a cross sectional view of FIG. 19A cut along the line A–A'. Reference numeral 801 shown by dotted lines indicates a source side driver circuit, reference numeral 806 indicates a pixel portion, and reference numeral 807 indicates a gate driver circuit. Further, reference numeral 901 indicates a cover member, reference numeral 902 indicates a first sealing member, reference numeral 903 indicates a second sealing member, and a sealing agent 907 is provided in the inner side surrounded by the first sealing member 902.

Note that, reference numeral 904 indicates a wiring for transmitting the signal to be input to the source side driver circuit 801 and the gate driver circuit 807, which receives a video signal or a clock signal from an FPC (flexible printed circuit) 905 to be an external input terminal. Note that, although only an FPC is shown here, a printed wiring board (PWB) may be mounted on the FPC. The EL display device in this specification includes not only the EL display device main body, but also a state where an FPC or a PWB is mounted thereon.

Next, the cross sectional structure is explained using FIG. 19B. The pixel portion 806 and the gate driver circuit 807 are formed on the substrate 700. The pixel portion 806 is formed of a plurality of pixels including the current control TFT 604 and the pixel electrode 710 electrically connected to the drain thereon. Further, the gate driver circuit 807 is formed using a CMOS circuit combining the n-channel TFT 601 and the p-channel TFT 602.

The pixel electrode 710 functions as an anode of an EL element. Further, the banks 712 are formed on both ends of the pixel electrode 710, and the EL layer 713 and the cathode 714 of the EL element are formed on the pixel electrode 710.

The cathode 714 functions as a common wiring of all the pixels, and is electrically connected to the FPC 905 via the connecting wiring 904. Further, the elements included in the pixel portion 806 and the gate driver circuit 807 are all covered by the cathode 714 and the passivation film 567.

Further, the cover member 901 is adhered by the first sealing member 902. Note that, a spacer made of a resin film may be provided to maintain a gap between the cover member 901 and the EL element. Then the sealing agent 907 is filled in the inner side of the first sealing member 902. Note that, it is preferable to use an epoxy resin as the first sealing member 902 and the sealing agent 907. Further, it is preferable that the first sealing member 902 is a material that does not transmit moisture or oxygen as much is possible. Further, a substance with a hygroscopic effect or a substance with an oxidation prevention effect may be contained in the inside of the sealing agent 907.

The sealing agent 907 provided so as to cover the EL element functions as an adhesive agent for adhering the cover member 901. Further, in this embodiment FRP (fiberglass-reinforced plastics), PVF (polyvinyl fluoride), mylar, polyester, or acrylic may be used as the material of a plastic substrate 901a which structures the cover member 901.

Further, after adhering the cover member 901 with the sealing agent 907, the second sealing member 903 is provided so as to cover the side surface (exposed surface) of the sealing agent 907. The same material may be used for both the first sealing member 902 and the second sealing member 903.

By filling the EL element into the sealing agent 907 in the above manner, the EL element may be completely blocked out from the outside, and the entering of substances which cause deterioration by oxidation of the EL layer by moisture or oxygen from the outside may be prevented. Therefore, an EL display device with a high reliability may be obtained.

[Embodiment 7]

In this embodiment, a method of manufacturing an active matrix substrate different from Embodiment 1 is explained with reference to FIGS. 20A to 20D.

Figure 20A:
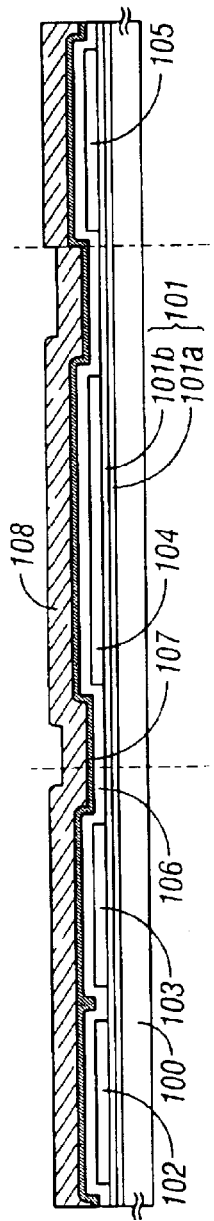
FIGS. 20A to 20D show a manufacturing process of an AM-LCD (Embodiment 7)

First, in accordance with Embodiment 1, the same state as in FIG. 11A is obtained (FIG. 20A).

Figure 20B:
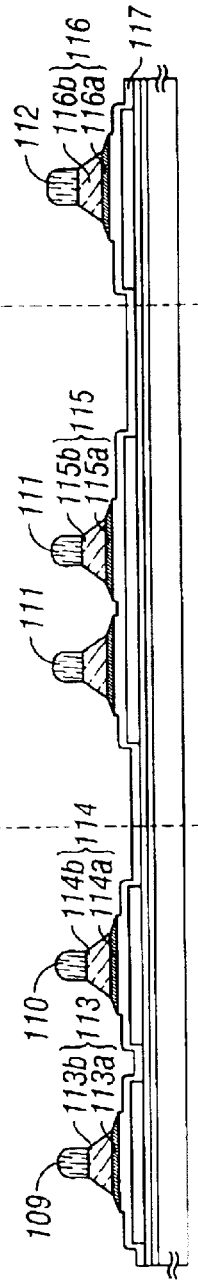

Next, according to Embodiment 1, the first etching process is performed (FIG. 20B). Note that, the first etching process corresponds to the second etching process described in Embodiment Mode 2 (FIG. 3C).

Figure 20C:
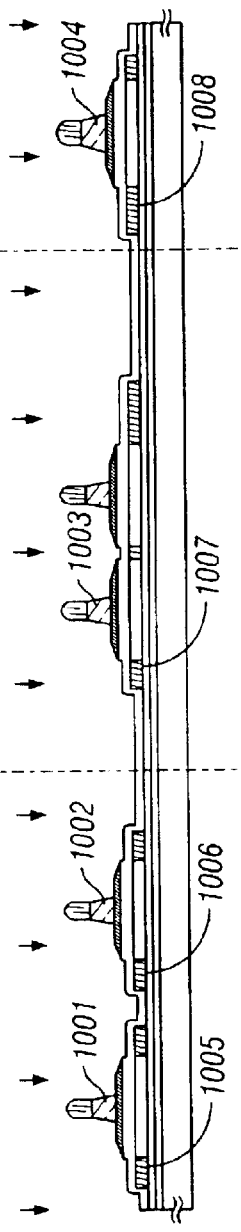

Next, after the second etching process is performed, the first doping process is conducted (FIG. 20C). In the second etching process, the same process as the second etching process of Embodiment 1 is conducted. The second conductive layers 113b to 116b are etched to become second conductive layers 1001 to 1004. Note that, the second etching process corresponds to the third etching process described in Embodiment Mode 2 (FIG. 3D). Further, in the first doping the same process as Embodiment 1 is performed, to form high concentration impurity regions 1005 to 1008. Further, the first doping process corresponds to the first doping process described in Embodiment Mode 2 (FIG. 4A).

Figure 20D:
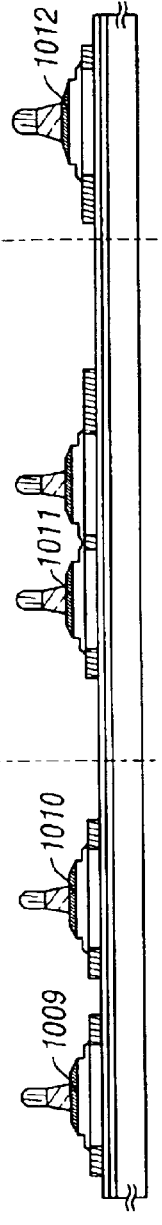

Next, the third etching process is performed (FIG. 20D). In the third etching process, the same process as the third etching process of Embodiment 1 is performed. Here the second conductive layers 113a to 116a are etched to become second conductive layers 1009 to 1012, and the insulating film 117 is simultaneously etched to form insulating films 1013a to 1013c and 1014. Note that, the third etching process corresponds to the fourth etching process described in Embodiment Mode 2 (FIG. 4B). Further, the second conductive layer 1009 corresponds to reference numeral 138 in FIG. 11D, the second conductive layer 1010 corresponds to reference numeral 139 in FIG. 11D, the second conductive layer 1011 corresponds to reference numeral 140 in FIG. 11D, and the second conductive layer 1012 corresponds to reference numeral 142 in FIG. 11D.

The subsequent steps are the same as those after FIG. 12A of Embodiment 1, and therefore they are omitted here.

Further, this embodiment may be freely combined with any of Embodiments 1 to 6.

[Embodiment 8]

In this embodiment, a method of manufacturing the active matrix substrate different from that in Embodiment 1 is explained with reference to FIGS. 21A to 21D.

First, according to Embodiment 1, the same state as in FIG. 11A is obtained (FIG. 21A).

Next, according to Embodiment 1, after conducting the etching process under the first etching condition, the first doping process of passing through the insulating film 106 and the first conductive film 107 is performed (FIG. 21B). Note that, the etching process under the first etching condition corresponds to the first etching process described in Embodiment Mode 3 (FIG. 5B). Further, this doping process corresponds to the first doping process described in Embodiment Mode 3 (FIG. 5C). By this first doping process high concentration impurity regions 1301 to 1304 are formed.

Next, according to Embodiment 1, the etching process under the second etching condition is performed, and thereafter the second etching process is performed according to Embodiment 1 (FIG. 21C). Note that, the etching process under the second etching condition corresponds to the second etching process described in Embodiment Mode 3 (FIG. 5D). Further, this second etching process corresponds to the third etching process described in Embodiment Mode 3 (FIG. 6A).

Next, the third etching process is performed (FIG. 21D). This third etching process is the same as the third etching process of Embodiment 1.

The subsequent steps are the same as those after FIG. 12A of Embodiment 1, and therefore they are omitted here.

Further, this embodiment may be freely combined with any of Embodiments 1 to 7.

[Embodiment 9]

In this embodiment, a method of manufacturing the active matrix substrate different from that in Embodiment 1 is explained with reference to FIG. 22. Note that, in FIG. 22, the portions corresponding to those in FIG. 13 use the same reference symbols. In Embodiment 1, an example of removing a portion of the insulating film and exposing a portion of the high concentration impurity region is shown, but this embodiment shows a process of suppressing the amount of etching of the insulating film in etching and covering the high concentration impurity region with a thin insulating film.

First, according to Embodiment 8, the same state as in FIG. 21B is obtained.

Next, as shown in Embodiment Mode 4 (FIG. 7D), after the second conductive layer is etched, further the third etching process is performed. Further, as shown in Embodiment Mode 5 (FIG. 9D), an electrode formed of a lamination of the first conductive layer and the second conductive layer may be formed by one etching (second etching process).

In this way, the amount of etching of the insulating film is suppressed and the insulating film 1400 which contacts the high concentration impurity region remains with a thickness of 5 to 50 nm.

The subsequent steps are the same as those after FIG. 12A of Embodiment 1, and therefore they are omitted herein.

Figure 22:
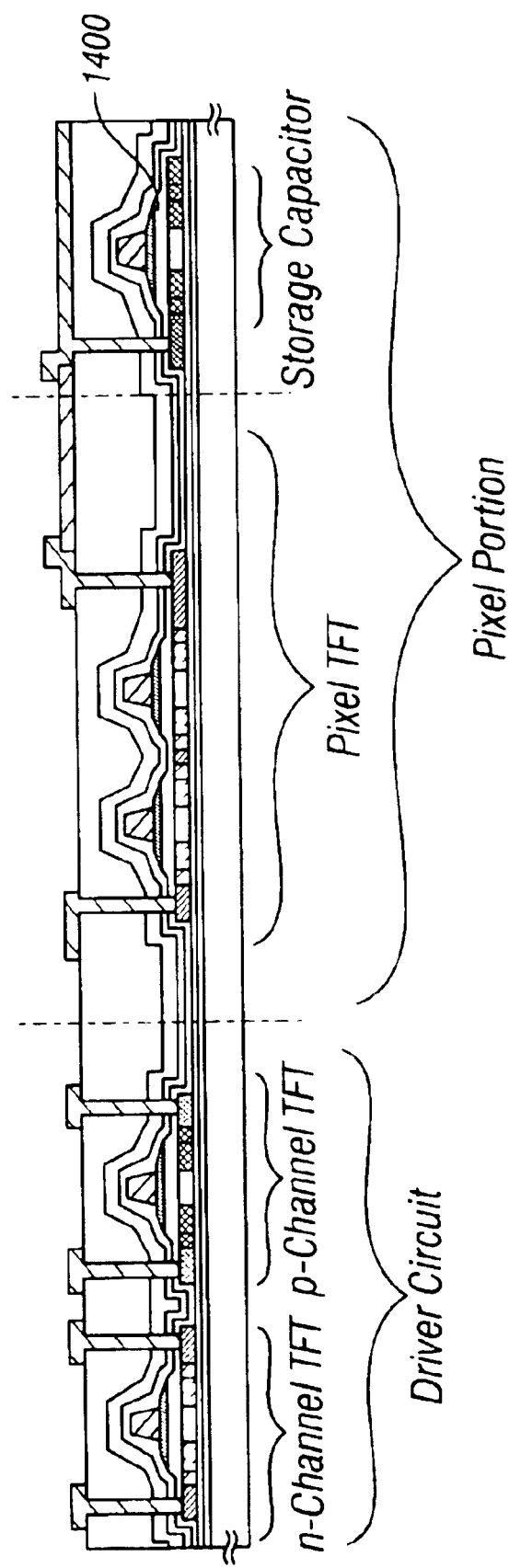
FIG. 22 shows a manufacturing process of an AM-LCD (Embodiment 9)

In this way, the active matrix substrate as shown in FIG. 22 may be manufactured.

Further, this embodiment may be freely combined with any of Embodiments 1 to 8.

[Embodiment 10]

The TFT formed by implementing an embodiment among Embodiments 1 to 9 can be used in various electro-optic apparatus (active matrix type liquid crystal display, active matrix EL display and active matrix type EC display). That is, the present invention can be implemented in all of electronic apparatus integrated with the electro-optic apparatus at display portions thereof.

As such electronic apparatus, there are pointed out a video camera, a digital camera, a projector, a head mount display (goggle type display), a car navigation system, a car stereo, a personal computer, a portable information terminal (mobile computer, portable telephone or electronic book) and the like. Examples of these are shown in FIGS. 23, 24 and 25.

Figure 23A:
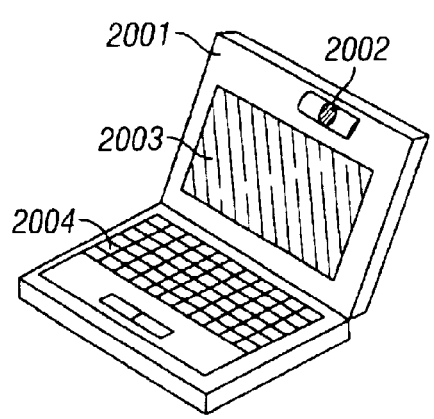
FIGS. 23A to 23F show examples of electronic equipment.

FIG. 23A shows a personal computer including a main body 2001, an image input portion 2002, a display portion 2003 and a keyboard 2004. The invention is applicable to the display portion 2003.

Figure 23B:
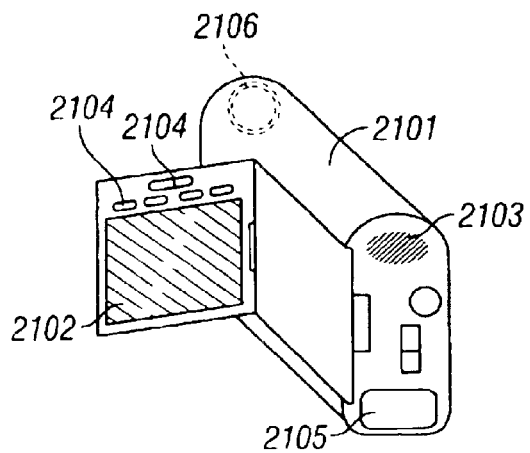

FIG. 23B shows a video camera including a main body 2101, a display portion 2102, a voice input portion 2103, operation switches 2104, a battery 2105 and an image receiving portion 2106. The invention is applicable to the display portion 2102.

Figure 23C:
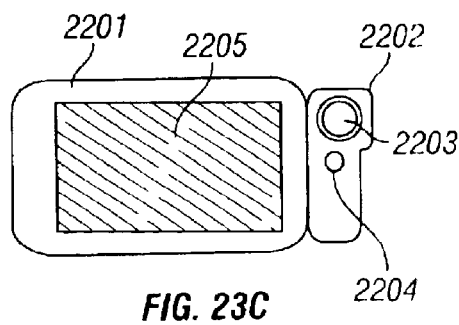

FIG. 23C shows a mobile computer including a main body 2201, a camera portion 2202, an image receiving portion 2203, an operation switch 2204 and a display portion 2205. The invention is applicable to the display portion 2205.

Figure 23D:
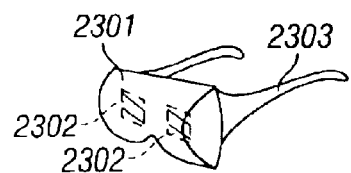

FIG. 23D shows a goggle type display including a main body 2301, a display portion 2302 and an arm portion 2303. The invention is applicable to the display portion 2302.

Figure 23E:
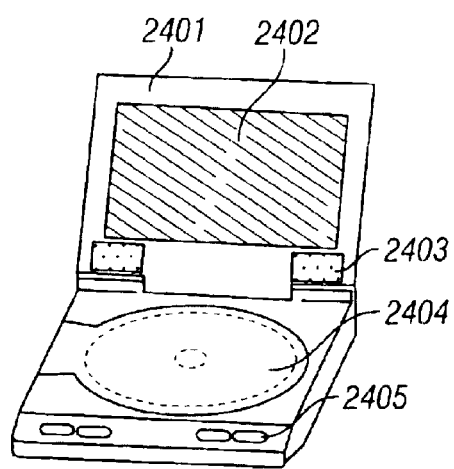

FIG. 23E shows a player using a record medium recorded with programs (hereinafter, referred to as record medium) including a main body 2401, a display portion 2402, a speaker portion 2403, a record medium 2404 and an operation switch 2405. The player uses DVD (digital Versatile Disc) or CD as the record medium and can enjoy music, enjoy movie and carry out game or Internet. The invention is applicable to the display portion 2402.

Figure 23F:
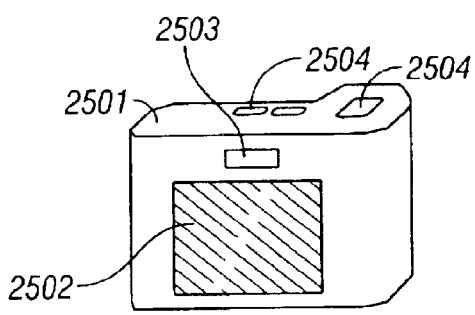

FIG. 23F shows a digital camera including a main body 2501, a display portion 2502, an eye contact portion 2503, operation switches 2504 and an image receiving portion (not illustrated). The invention is applicable to the display portion 2502.

Figure 24A:
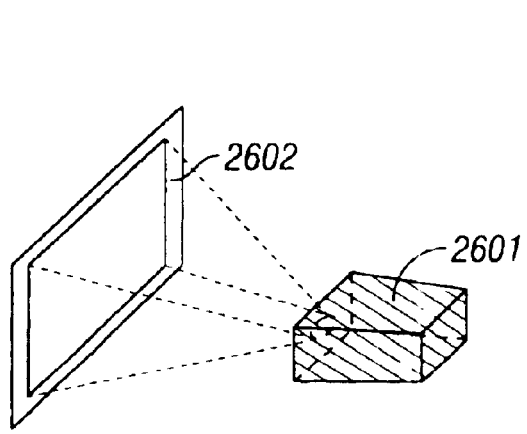
FIGS. 24A to 24D show examples of electronic equipment.

FIG. 24A shows a front type projector including a projection apparatus 2601 and a screen 2602. The invention is applicable to a liquid crystal display apparatus 2808 constituting a portion of the projection apparatus 2601 and other driver circuits.

Figure 24B:
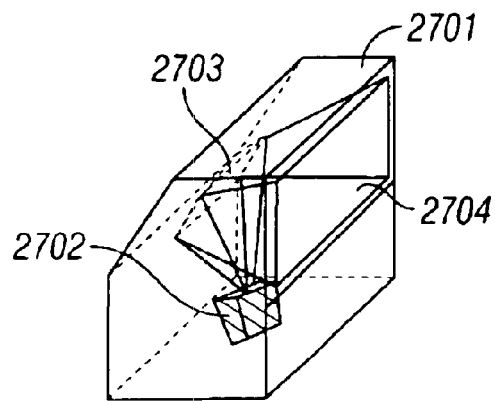

FIG. 24B shows a rear type projector including a main body 2701, a projection apparatus 2702, a mirror 2703 and a screen 2704. The invention is applicable to a signal control circuit of the liquid crystal display apparatus 2808 constituting a portion of the projection apparatus 2702 and other driver circuits.

Figure 24C:
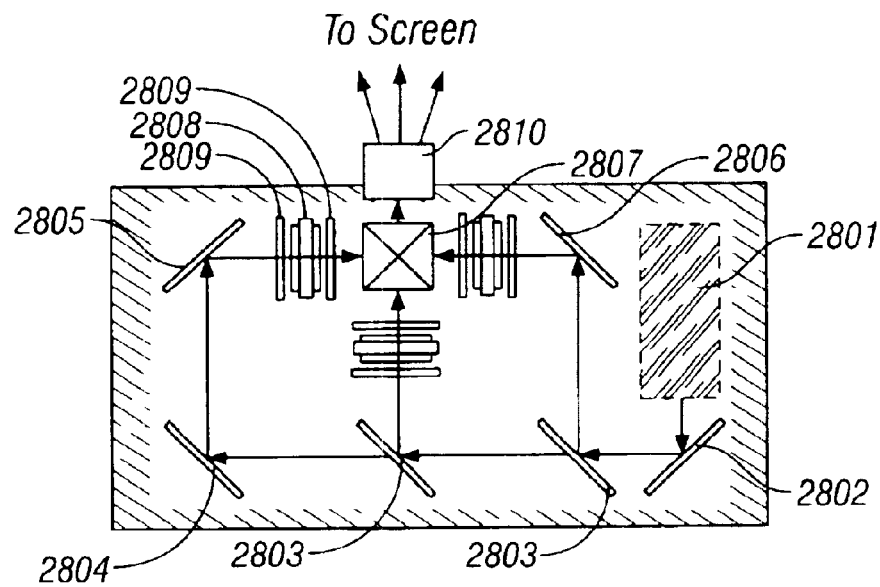

Further, FIG. 24C is a view showing an example of a structure of the projection apparatus 2601 and 2702 in FIG. 24A and FIG. 24B. The projection apparatus 2601 or 2702 is constituted by a light source optical system 2801, mirrors 2802, and 2804 through 2806, a dichroic mirror 2803, a prism 2807, a liquid crystal display apparatus 2808, a phase difference plate 2809 and a projection optical system 2810. The projection optical system 2810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 24C.

Figure 24D:
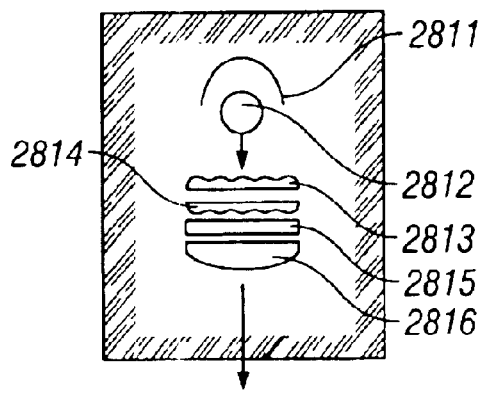

Further, FIG. 24D is a view showing an example of a structure of the light source optical system 2801 in FIG. 24C. According to the embodiment, the light source optical system 2801 is constituted by a reflector 2811, a light source 2812, lens arrays 2813 and 2814, a polarization conversion element 2815 and a focusing lens 2816. Further, the light source optical system shown in FIG. 24D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIG. 24, there is shown a case of using a transmission type electro-optic apparatus and an example of applying a reflection type electro-optic apparatus and a reflection type EL display device are not illustrated.

Figure 25A:
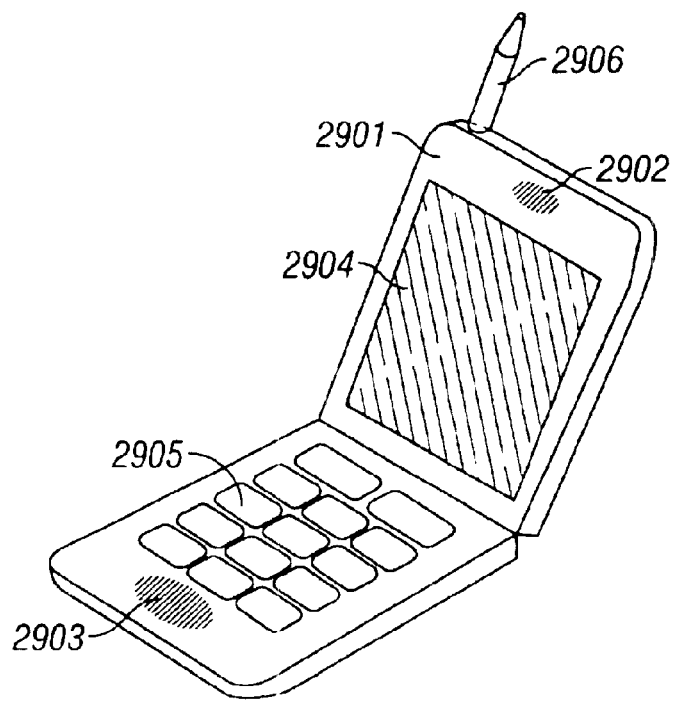
FIGS. 25A to 25C show examples of electronic equipment.

FIG. 25A shows a portable telephone including a main body 2901, a voice output portion 2902, a voice input portion 2903, a display portion 2904, an operation switch 2905 and an antenna 2906. The invention is applicable to the display portion 2904.

Figure 25B:
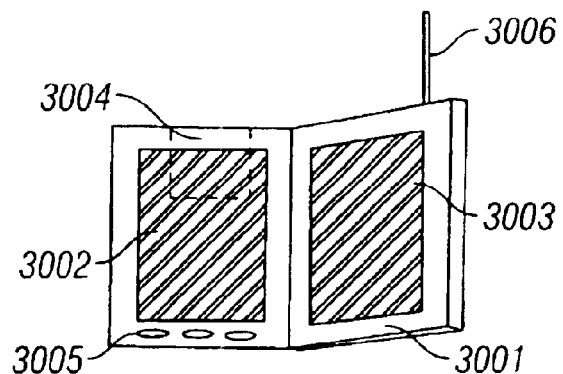

FIG. 25B shows a portable book (electronic book) including a main body 3001, display portions 3002 and 3003, a record medium 3004, an operation switch 3005 and an antenna 3006. The invention is applicable to the display portions 3002 and 3003.

Figure 25C:
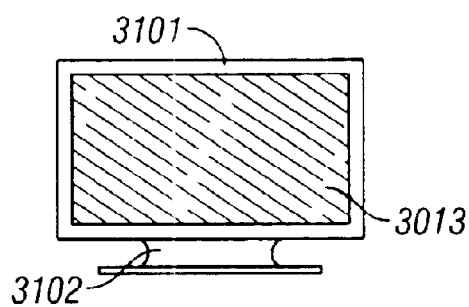

FIG. 25C shows a display including a main body 3101, a support base 3102 and a display portion 3103. The invention is applicable to the display portion 3103. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields. Further, the electronic apparatus of the embodiment can be realized by using any constitution comprising any combinations of embodiments 1 through 6.

According to the present invention, the TFT provided with the GOLD region and the LDD region can be manufactured with a small number of masks. Accordingly, the GOLD region overlapping the gate electrode can achieve relaxation of the electric field concentration, thereby making it possible to prevent the deterioration due to the hot carrier, and the LDD region not overlapping the gate electrode can suppress the off current value.

Further, the first conductive layer overlapping the GOLD region can be freely controlled in accordance with the etching condition. Therefore, the width of the low concentration impurity region overlapping the gate electrode (the GOLD region) and the width of the low concentration impurity region not overlapping the gate electrode (the LDD region) can be set to the desired values.

What is claimed is:

1. A method of manufacturing a semiconductor device comprising the steps of:
   forming a semiconductor layer on an insulating surface;
   forming an insulating film on said semiconductor layer;
   forming a first electrode comprising a first conductive layer having a first width on said insulating film and a second conductive layer on said first conductive layer;
   forming a high concentration impurity region in said semiconductor layer by adding a first impurity element using said first electrode as a mask;
   forming a second electrode comprising said first conductive layer having said first width and said second conductive layer having a second width that is different from said first width by etching said second conductive layer of said first electrode;
   forming a third electrode comprising said first conductive layer having a third width that is different from said first and second widths and said second conductive layer having said second width by etching said first conductive layer of said second electrode; and
   forming a low concentration impurity region in said semiconductor layer by adding a second impurity element through at least one of said first conductive layer and said insulating film using said second conductive layer as a mask.

2. The method according to claim 1 wherein said second width is narrower than said first width.

3. The method according to claim 1 wherein said third width is narrower than said first width and is wider than said second width.

4. The method according to claim 1 wherein, after a first conductive film and a second conductive film are formed in a lamination on said insulating film, said second conductive layer is formed by performing a first etching process with said second conductive film, and said first conductive layer having said first width is formed by performing a second etching process with said first conductive film, whereby said first electrode comprising said first conductive layer having said first width and said second conductive layer is formed.

5. The method according to claim 1 wherein said first conductive layer comprises TaN.

6. The method according to claim 1 wherein said second conductive layer comprises W.

7. The method according to claim 1 wherein said impurity element comprises phosphorus.

8. The method according to claim 1 wherein said semiconductor device is an electro-luminescence display device.

9. The method according to claim 1 wherein said semiconductor device is at least one selected form the group consisting of a video camera, a digital camera, a projector, a goggle-type display, a car navigation, a personal computer, a player using a recording medium, a mobile computer, an electronic book, and a portable telephone.

10. A method of manufacturing a semiconductor device comprising the steps of:
    forming a semiconductor layer on an insulating surface;
    forming an insulating film on said semiconductor layer;
    forming a first conductive film and a second conductive film in a lamination on said insulating film;
    forming a second conductive layer having a first width by etching said second conductive film;
    forming a high concentration impurity region in said semiconductor layer by adding a first impurity element through at least one of said first conductive film and said insulating film using said second conductive layer having said first width as a mask;
    forming a first electrode comprising a first conductive layer having a second width that is different from said first width and said second conductive layer having a third width that is different from said first and second widths by etching said first conductive film;
    forming a second electrode comprising said first conductive layer having said second width and said second conductive layer having a fourth width that is different from said first, second and third widths by etching said second conductive layer of said first electrode;
    forming a third electrode comprising said first conductive layer having a fifth width and said second conductive layer having said fourth width by etching said first conductive layer of said second electrode; and
    forming a low concentration impurity region in said semiconductor layer by adding a second impurity element through at least one of said first conductive layer and said insulating film using said second conductive layer having said fourth width as a mask.

11. The method according to claim 10 wherein said second width is narrower than said first width.

12. The method according to claim 10 wherein said fifth width is narrower than said second width and is wider than said fourth width.

13. The method according to claim 10 wherein said first conductive layer comprises TaN.

14. The method according to claim 10 wherein said second conductive layer comprises W.

15. The method according to claim 10 wherein said impurity element comprises phosphorus.

16. The method according to claim 10 wherein said semiconductor device is an electro-luminescence display device.

17. The method according to claim 10 wherein said semiconductor device is at least one selected form the group consisting of a video camera, a digital camera, a projector, a goggle-type display, a car navigation, a personal computer, a player using a recording medium, a mobile computer, and electronic book, and a portable telephone.

18. A method of manufacturing a semiconductor device comprising the steps of:

forming a semiconductor layer on an insulating surface;

forming an insulating film on said semiconductor layer;

forming a first conductive film and a second conductive film in a lamination on said insulating film;

forming a second conductive layer having a first width by etching said second conductive film;

forming a high concentration impurity region in said semiconductor layer by adding a first impurity element through at least one of said first conductive film and said insulating film using said second conductive layer having said first width as a mask;

forming said second conductive layer having a second width that is different from said first width by etching said second conductive layer;

forming an electrode comprising a first conductive layer having a third width that is different from said first and second widths and said second conductive layer having said second width by etching said first conductive film; and forming a low concentration impurity region in said semiconductor layer by adding a second impurity element through at least one of said first conductive layer and said insulating film using said second conductive layer having said second width as a mask.

19. The method according to claim 18 wherein said second width is narrower than said first width.

20. The method according to claim 18 wherein said third width is narrower than said first width and is wider than said second width.

21. The method according to claim 18 wherein said first conductive layer comprises TaN.

22. The method according to claim 18 wherein said second conductive layer comprises W.

23. The method according to claim 18 wherein said impurity element comprises phosphorus.

24. The method according to claim 18 wherein said semiconductor device is an electro-luminescence display device.

25. The method according to claim 18 wherein said semiconductor device is one selected form the group consisting of a video camera, a digital camera, a projector, a goggle-type display, a car navigation, a personal computer, a player using a recording medium, a mobile computer, an electronic book, and a portable telephone.

26. A method of manufacturing a semiconductor device comprising the steps of:

forming a semiconductor layer on an insulating surface;

forming an insulating film on said semiconductor layer;

forming a first conductive film and a second conductive film in a lamination on said insulating film;

forming a second conductive layer having a first width by etching said second conductive film;

forming a high concentration impurity region in said semiconductor layer by adding a first impurity element through at least one of said first conductive film and said insulating film using said second conductive layer having said first width as a mask;

forming an electrode comprising a first conductive layer having a second width that is different from said first width and said second conductive layer having a third width that is different from said first and second widths by etching said first conductive film and said second conductive layer; and forming a low concentration impurity region in said semiconductor layer by adding a second impurity element through at least one of said first conductive layer and said insulating film using said second conductive layer having said third width as a mask.

27. The method according to claim 26 wherein said third width is narrower than said first width.

28. The method according to claim 26 wherein said second width is narrower than said first width and is wider than said third width.

29. The method according to claim 26 wherein said first conductive layer comprises TaN.

30. The method according to claim 26 wherein said second conductive layer comprises W.

31. The method according to claim 26 wherein said impurity element comprises phosphorus.

32. The method according to claim 26 wherein said semiconductor device is an electro-luminescence display device.

33. The method according to claim 26 wherein said semiconductor device is at least one selected from the group consisting of a video camera, a digital camera, a projector, a goggle-type display, a car navigation, a personal computer, a player using a recording medium, a mobile computer, an electronic book, and a portable telephone.

* * * * *